(12) United States Patent
Chen et al.

(10) Patent No.: US 9,478,500 B2
(45) Date of Patent: Oct. 25, 2016

(54) INTERPOSER SUBSTRATE, SEMICONDUCTOR STRUCTURE AND FABRICATING PROCESS THEREOF

(71) Applicant: Advanced Semiconductor Engineering, Inc., Kaohsiung (TW)

(72) Inventors: Chia-Ching Chen, Kaohsiung (TW); Chin-Li Kao, Kaohsiung (TW); Hung-Jen Chang, Kaohsiung (TW); Tang-Yuan Chen, Kaohsiung (TW); Wei-Hong Lai, Kaohsiung (TW)

(73) Assignee: ADVANCED SEMICONDUCTOR ENGINEERING, INC., Kaosiung (TW)

( * ) Notice: Subject to any disclaimer, the term of this patent is extended or adjusted under 35 U.S.C. 154(b) by 0 days.

(21) Appl. No.: 14/624,331

(22) Filed: Feb. 17, 2015

(65) Prior Publication Data

US 2016/0240481 A1 Aug. 18, 2016

(51) Int. Cl.
*H01L 21/48* (2006.01)
*H01L 23/538* (2006.01)
*H01L 23/498* (2006.01)
*H01L 21/683* (2006.01)
*H05K 1/11* (2006.01)

(52) U.S. Cl.
CPC ....... *H01L 23/5389* (2013.01); *H01L 21/4857* (2013.01); *H01L 21/6835* (2013.01); *H01L 23/49822* (2013.01); *H01L 23/49827* (2013.01); *H01L 23/49833* (2013.01); *H01L 23/49838* (2013.01); *H05K 1/113* (2013.01); *H01L 2221/68345* (2013.01)

(58) Field of Classification Search
USPC .......................................................... 257/692
See application file for complete search history.

(56) References Cited

U.S. PATENT DOCUMENTS

| 6,313,522 | B1 | 11/2001 | Akram et al. | |
| 8,304,878 | B2 | 11/2012 | Appelt | |
| 8,519,524 | B1* | 8/2013 | Wu | H01L 25/0652 174/256 |
| 8,519,537 | B2* | 8/2013 | Jeng | H01L 23/13 257/668 |
| 2010/0171206 | A1* | 7/2010 | Chu | H01L 21/565 257/686 |
| 2011/0037161 | A1* | 2/2011 | Andry | H01L 23/5384 257/692 |
| 2012/0056336 | A1 | 3/2012 | Ou et al. | |
| 2013/0241052 | A1* | 9/2013 | Chang | H01L 23/481 257/737 |
| 2014/0102777 | A1* | 4/2014 | Chen | H05K 3/4038 174/266 |
| 2015/0325536 | A1* | 11/2015 | Jeng | H01L 23/5383 257/695 |
| 2016/0039663 | A1* | 2/2016 | Lin | B81B 7/007 257/415 |

* cited by examiner

*Primary Examiner* — Thao P Le
(74) *Attorney, Agent, or Firm* — Foley & Lardner LLP; Cliff Z Liu; Angela D. Murch

(57) ABSTRACT

Described herein are interposer substrate designs for warpage control, semiconductor structures including said interposer substrates, and fabricating processes thereof. An interposer substrate defines a cavity and further includes a reinforcement structure, wherein the reinforcement structure is used to control warpage of the semiconductor package structure.

24 Claims, 15 Drawing Sheets

INTERPOSER SUBSTRATE, SEMICONDUCTOR STRUCTURE AND FABRICATING PROCESS THEREOF

BACKGROUND

1. Technical Field

The present disclosure relates, in general, to interposer substrate design for Package-on-Package (PoP) structures, and, more specifically, interposer substrate design including reinforcement of the interposer substrate, and fabrication thereof.

2. Description of the Related Art

There is continued demand for miniaturization, weight reduction, improved performance, improved reliability and lower cost in electronic products, and particularly so for mobile phones and wearable electronics. Correspondingly, packaging improvements such as system-on-chip (SoC) have been developed. SoC integrates multiple functionalities at the chip level; however, the design and testing of SoC packages are relatively difficult, and SoC manufacturing is relatively high cost and low yield. Therefore, there is a continuing drive to develop other types of multiple functional integration technologies with increased circuit density, ones that are relatively inexpensive, easy to manufacture, and use standard configurations and components.

SUMMARY

The present disclosure provides an interposer substrate including a reinforcement structure to control warpage of the interposer substrate, to maintain the planarity of the interposer substrate and to reinforce the interposer substrate.

An embodiment of the present disclosure is directed to an interposer substrate, comprising: a first core layer; a first conductive layer on a first side of the interposer substrate and comprising a plurality of first pads; a second conductive layer on a second side of the interposer substrate and comprising a plurality of second pads, wherein the second side of the interposer substrate is opposite the first side of the interposer substrate; a plurality of conductive vias electrically connecting the first conductive layer and the second conductive layer; and a reinforcement structure in the interposer substrate, where the interposer substrate defines a cavity.

Another embodiment of the present disclosure is directed to an interposer substrate, comprising: a core layer; a first conductive layer on a first side of the interposer substrate and comprising a plurality of first pads; a second conductive layer on a second side of the interposer substrate and comprising a plurality of second pads; a plurality of conductive vias electrically connecting the first conductive layer and the second conductive layer; a first insulating layer on the first side of the interposer substrate, wherein the first insulating layer defines a plurality of openings to expose the plurality of first pads; a second insulating layer on the second side of the interposer substrate, wherein the second insulating layer defines a plurality of openings to expose the plurality of second pads; and the interposer substrate defines a cavity, wherein the second insulating layer and the cavity are on the same side of the interposer substrate, and a ratio of a thickness of the first insulating layer to a thickness of the second insulating layer is less than one.

Another embodiment of the present disclosure is directed to a process of fabricating an interposer substrate, comprising: (a) providing a carrier; (b) forming a protrusion on the carrier; (c) forming a core layer on the protrusion and the carrier, wherein the core layer has a first surface and a second surface; (d) removing the carrier; (e) forming a first conductive layer on the first surface of the core layer and forming a second conductive layer on the second surface of the core layer, wherein the first conductive layer includes a plurality of first pads and the second conductive layer includes a plurality of second pads; and (f) removing at least a portion of the protrusion to form a cavity in the core layer.

Another embodiment of the present disclosure is directed to a semiconductor structure comprising: a base substrate having a first surface including a plurality of base substrate pads thereon; an interposer substrate comprising: a first core layer, a first conductive layer on a first side of the interposer substrate and comprising a plurality of first pads, a second conductive layer on a second side of the interposer substrate and comprising a plurality of second pads, a plurality of conductive vias electrically connecting the first conductive layer and the second conductive layer, and a reinforcement structure in the interposer substrate, wherein the interposer substrate defines a cavity, wherein at least one of the first and the second pads is electrically coupled to at least one of the plurality of base substrate pads; and a semiconductor device is positioned at least partially within the cavity between the base substrate and the interposer substrate.

Another embodiment of the present disclosure is directed to a semiconductor structure comprising: a base substrate having a first surface including a plurality of base substrate pads thereon; an interposer substrate comprising: a core layer, a first conductive layer on a first side of the interposer substrate and comprising a plurality of first pads, a second conductive layer on a second side of the interposer substrate and comprising a plurality of second pads, a plurality of conductive vias electrically connecting the first conductive layer and the second conductive layer, a first insulating layer on the first side of the interposer substrate, wherein the first insulating layer defines a plurality of openings to expose the plurality of first pads, a second insulating layer on the second side of the interposer substrate, wherein the second insulating layer defines a plurality of openings to expose the plurality of second pads, wherein the interposer substrate defines a cavity, wherein the second insulating layer and the cavity are on the same side of the interposer substrate, and a ratio of a thickness of the first insulating layer to a thickness of the second insulating layer is less than one, and wherein at least one of the first pads and the second pads is electrically coupled to at least one of the plurality of base substrate pads; and a semiconductor device is positioned at least partially within the cavity between the base substrate and the interposer substrate.

Other aspects and embodiments of the disclosure have also been contemplated. The summary and detailed descriptions are not meant to restrict the disclosure to any particular embodiment, but are merely meant to describe some embodiments of the disclosure.

BRIEF DESCRIPTION OF THE DRAWINGS

For a better understanding of the nature and objects of some embodiments of the disclosure, reference should be made to the following detailed description taken in conjunction with the accompanying drawings. In the drawings, like reference numbers denote like components, unless the context clearly dictates otherwise.

DETAILED DESCRIPTION

Figure 1A:
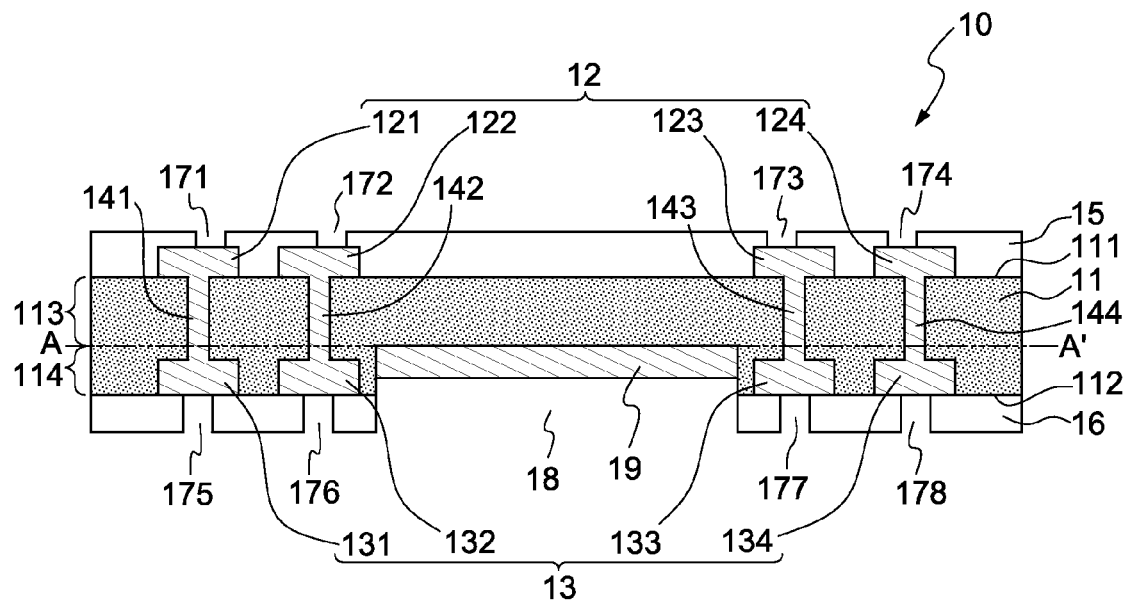
FIGS. 1A, 1B, 1C and 1D show interposer substrates with reinforcing layers in a cavity, according to an embodiment of the present disclosure.
Figure 1B:
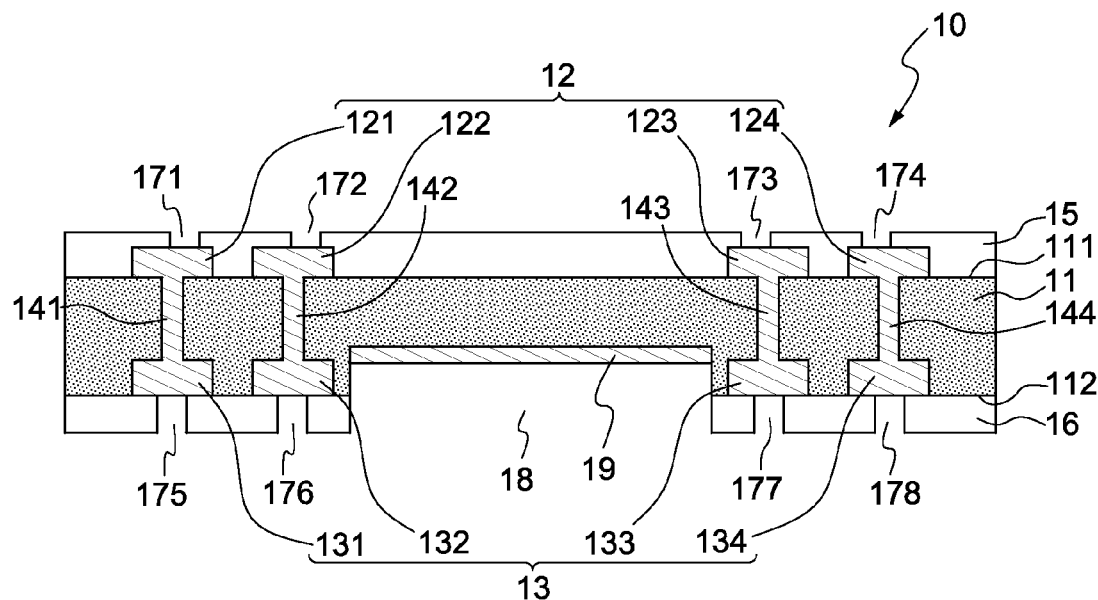
Figure 1C:
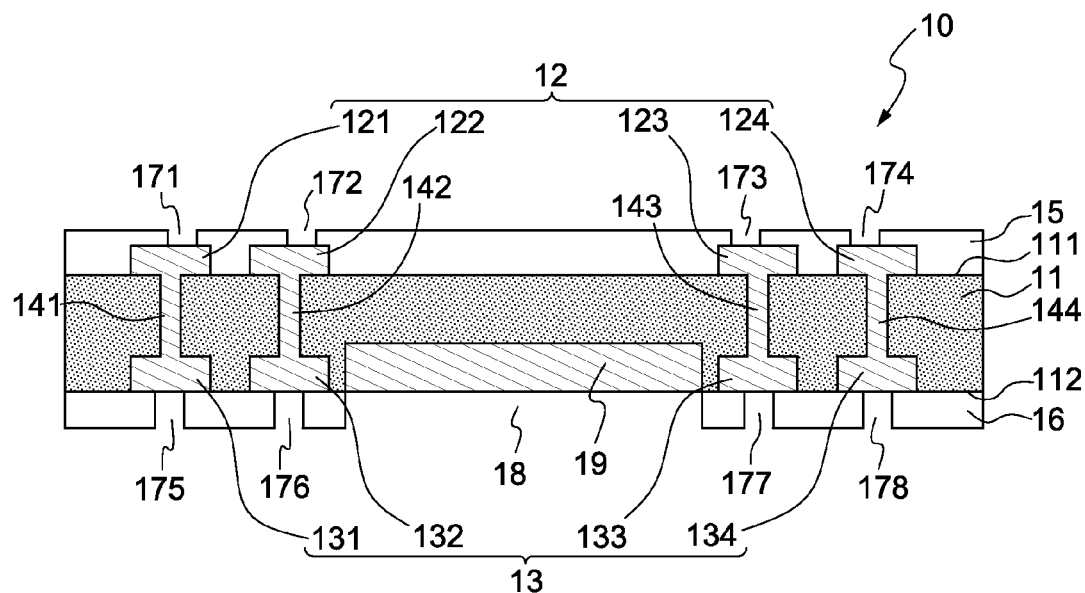
Figure 1D:
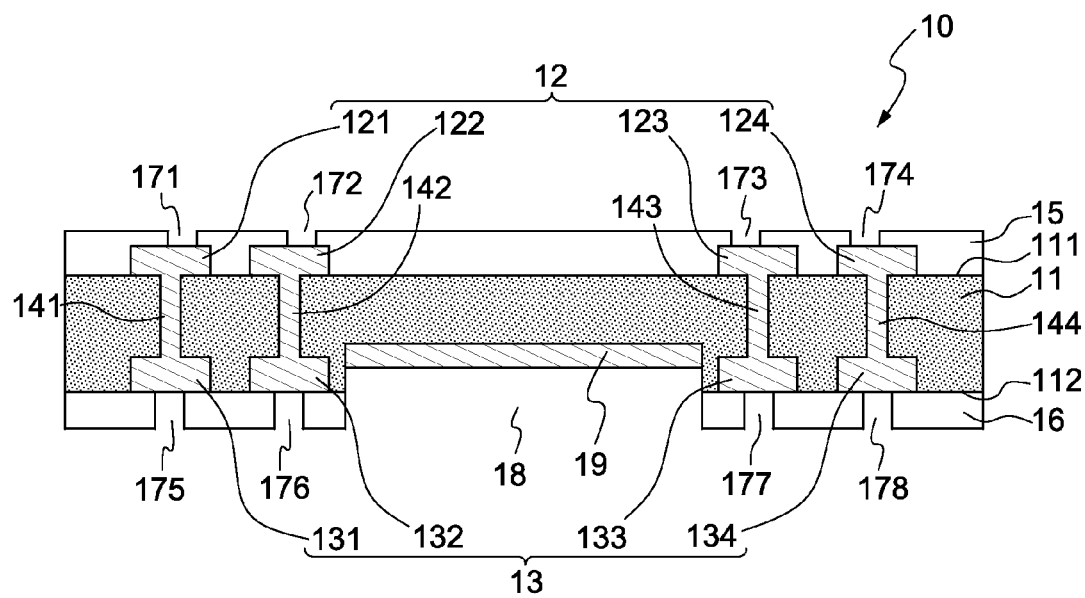

The following definitions apply to some of the aspects described with respect to some embodiments of the disclosure. These definitions may likewise be expanded upon herein.

As used herein, the singular terms "a," "an," and "the" include plural referents unless the context clearly dictates otherwise. Thus, for example, reference to reinforcing layer can include multiple reinforcing layers unless the context clearly dictates otherwise.

As used herein, the term "set" refers to a collection of one or more components. Thus, for example, a set of layers can include a single layer or multiple layers. Components of a set also can be referred to as members of the set. Components of a set can be the same or different. In some instances, components of a set can share one or more common characteristics.

As used herein, the term "adjacent" refers to being near or adjoining Adjacent components can be spaced apart from one another or can be in actual or direct contact with one another. In some instances, adjacent components can be connected to one another or can be formed integrally with one another.

As used herein, relative terms, such as "inner," "interior," "outer," "exterior," "top," "bottom," "front," "back," "upper," "upwardly," "lower," "downwardly," "vertical," "vertically," "lateral," "laterally," "above," and "below," refer to an orientation of a set of components with respect to one another, such as in accordance with the drawings, but do not require a particular orientation of those components during manufacturing or use.

As used herein, the terms "connect," "connected," and "connection" refer to an operational coupling or linking Connected components can be directly coupled to one another or can be indirectly coupled to one another, such as through another set of components.

As used herein, the terms "electrically conductive" and "electrical conductivity" refer to an ability to transport an electric current. Electrically conductive materials typically correspond to those materials that exhibit little or no opposition to flow of an electric current. One measure of electrical conductivity is in terms of Siemens per meter (S/m). Typically, an electrically conductive material is one having a conductivity greater than approximately $10^4$ S/m, such as at least approximately $10^5$ S/m or at least approximately $10^6$ S/m. Electrical conductivity of a material can sometimes vary with temperature. Unless otherwise specified, electrical conductivity of a material is defined at room temperature.

As used herein, the terms "approximately," "substantially" "substantial," and "about" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing methods described herein. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a first thickness described as "substantially equal" to a second thickness indicates the difference between the thicknesses is less than or equal to ±10% of the second thickness, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

As used herein, the term "warpage" refers to deformation of the structure of a substrate which reduces a planarity of one or more surfaces of the substrate. Magnitude of the warpage may be determined by the distance between the lowest point of a deformation of the substrate to the highest point of the deformation. Each substrate may have a different degree of warpage resulting from a change from room temperature (e.g., 25° C.) to reflow temperature (e.g., 260° C.), or from reflow temperature to room temperature. Further, warpage may occur while the semiconductor substrate stays at a steady temperature, due to a mismatch in the coefficient of thermal expansion (CTE) between different components of the substrate. In other words, two sides of the substrate may be subject to different degrees of thermal expansion, resulting in stress effects that cause warpage. Additionally, as the overall thickness of the semiconductor structure decreases, warpage in a semiconductor structure is more pronounced. Therefore, a solution for preventing warpage would be beneficial to the semiconductor industry.

Because of the difficulties associated with SoC packaging, there has been a tendency for multiple functional integration technology to move towards system-in-package (SiP) development. One multiple functional integration technology is PoP, a multi-package stacking that aims to reduce the placement and routing areas on a board. In general, warpage can reach up to several hundred micrometers in a PoP device, which can cause a solder crack at an interconnection between stacked substrates, and thereby dramatically decrease yield. A solution for warpage in PoP packaging is described in this disclosure.

PoP techniques relate to integrated circuit packaging that combines vertically discrete logic and memory ball grid array (BGA) packages. Two or more packages are installed atop each other (i.e. stacked), with interposer substrates to route signals between the packages. To allow for higher component density, a PoP semiconductor structure may be formed through alternately stacking semiconductor devices and interposer substrates. The interposer substrates can be electrically connected through plated through holes (PTH) or conductive vias penetrating the interposer substrates. To further increase the circuit density of a PoP semiconductor structure, the interposer substrate may include cavities or openings to accommodate flip chips or semiconductor devices. The flip chips or semiconductor devices from adjacent substrates may extend into the cavities or openings of the interposer substrate, and thus reduce the overall size of the stacked semiconductor structure in a PoP device.

The cavities or openings of the interposer substrate may tend to increase the warpage of the interposer substrate. The present disclosure provides an interposer substrate in which warpage is minimized, to maintain the planarity of the interposer substrate and to reinforce the interposer substrate.

Referring to FIGS. 1A to 1D, an interposer substrate 10 according to a first embodiment of the present disclosure is shown. As shown in FIG. 1A, an interposer substrate 10 includes a core layer 11, a first conductive layer 12, a second conductive layer 13, a plurality of conductive vias 141, 142, 143 and 144, a cavity 18 and a reinforcement structure in the form of a reinforcing layer 19. While one cavity 18 is shown in FIGS. 1A to 1D, more cavities can be included for other embodiments. The reinforcing layer 19 is illustrated as being of different thicknesses in FIGS. 1A, 1B, 1C and 1D. In some embodiments, a thickness of the reinforcing layer 19 is at least about 6 μm, at least about 9 μm, at least about 10 μm, at least about 12 μm, at least about 15 μm, at least about 18 μm, or at least about 30 μm, and up to or less than a height of cavity 18.

The core layer 11 has a first surface 111 and a second surface 112 opposite the first surface 111. The core layer 11 can be formed from a dielectric material, such as polyimide, polybenzoxazole, benzocyclobutene, or a combination thereof. The thickness of the core layer 11 can be in a range of approximately 50 μm to approximately 150 μm.

The first conductive layer 12 is formed on the first surface 111 of the core layer 11, and the second conductive layer 13 is formed on the second surface 112 of the core layer 11. The first conductive layer 12 and the second conductive layer 13 can be formed from a metal, a metal alloy, a matrix with a metal or a metal alloy dispersed therein or another suitable electrically conductive material. For example, the first conductive layer 12 and the second conductive layer 13 may each be formed from aluminum, copper, titanium or a combination thereof. The thickness of the conductive layers 12 and 13 can be in a range of approximately 10 μm to approximately 30 μm. The conductive vias 141, 142, 143 and 144 electrically connect the first conductive layer 12 and the second conductive layer 13, wherein the first conductive layer 12 and the second conductive layer 13 both comprise a plurality of pads and traces. While four pads 121, 122, 123 and 124 of the first conductive layer 12 and four pads 131, 132, 133 and 134 of the second conductive layer 13 are shown in FIG. 1A, it is possible that more, or fewer, pads and traces can be included, such as for routing between other substrates while the other substrates and the interposer substrate 10 are stacked. Moreover, although the second conductive layer 13 is illustrated as being embedded into the core layer 11, the first conductive layer 12 may also be embedded into the core layer 11.

A first insulating layer 15 covers the first conductive layer 12 and the first surface 111 of the core layer 11, and a second insulating layer 16 covers the second conductive layer 13 and the second surface 112 of the core layer 11. The first insulating layer 15 includes a plurality of openings 171, 172, 173, 174 to expose the respective pads 121, 122, 123 and 124. The second insulating layer 16 includes a plurality of openings 175, 176, 177 and 178 to expose the respective pads 131, 132, 133 and 134. The pads 121, 122, 123, 124, 131, 132, 133 and 134 are exposed for electrically connecting to other substrates stacked with the interposer substrate 10. The material of the first and second insulating layers 15 and 16 can be non-conductive materials such as, for example, epoxy resin or solder resist.

The cavity 18 is downwardly recessed from the second surface 112 of the core layer 11. In the embodiment illustrated in FIGS. 1A-1C, cavity 18 is approximately centered on the interposer substrate 10 and is peripherally surrounded by the core layer 11. That is, the cavity 18 provides an accommodating space for components of the PoP device, such a semiconductor die, a metal layer or a polymer layer. The cavity 18 extends to the core layer 11, and the imaginary line where the cavity 18 meets the core layer 11 (i.e., along dotted line A-A' in FIG. 1A) defines an upper portion 113 of the core layer 11 above the line, and a lower portion 114 of the core layer 11 below the line.

The CTE of the metal layers (e.g., first conductive layer 12 and second conductive layer 13) is different from that of the core layer(s) (e.g., core layer 11). The first conductive layer 12 may comprise traces (not shown) at locations above the cavity on the first surface 11 of the core layer 11. Hence, the interposer substrate 10 may be subject to warpage after being heated and then cooled, due to the different CTEs of the traces of the first conductive layer 12 and the core layer 112. Further, cavity 18 formed in the interposer substrate 10 may itself cause warpage. To address these difficulties, interposer substrate 10 further includes the reinforcing layer 19.

Table 1 shows a variation of warpage for the interposer substrate 10 with and without a cavity 18, and without a reinforcing layer 19. As shown in Table 1, the warpage severity of the interposer substrate 10 with the cavity 18 is more than five times the warpage severity of the interposer substrate without the cavity 18.

TABLE 1

|  | No cavity | With cavity | Unit |
| --- | --- | --- | --- |
| First conductive layer thickness |  | 18 | μm |
| Second conductive layer thickness |  | 18 | μm |
| First insulating layer thickness |  | 20 | μm |
| Second insulating layer thickness |  | 20 | μm |
| Core layer type |  | NS |  |
| Core layer thickness |  | 100 | μm |
| Height of the cavity | — | 50 | μm |
| Warpage at 25° C. | −104 | −783 | μm |
| Warpage at 260° C. | 57 | 77 | μm |
| Total warpage | 161 | 860 | μm |
| Warpage severity | 100 | 543 | % |

Figure 1E:
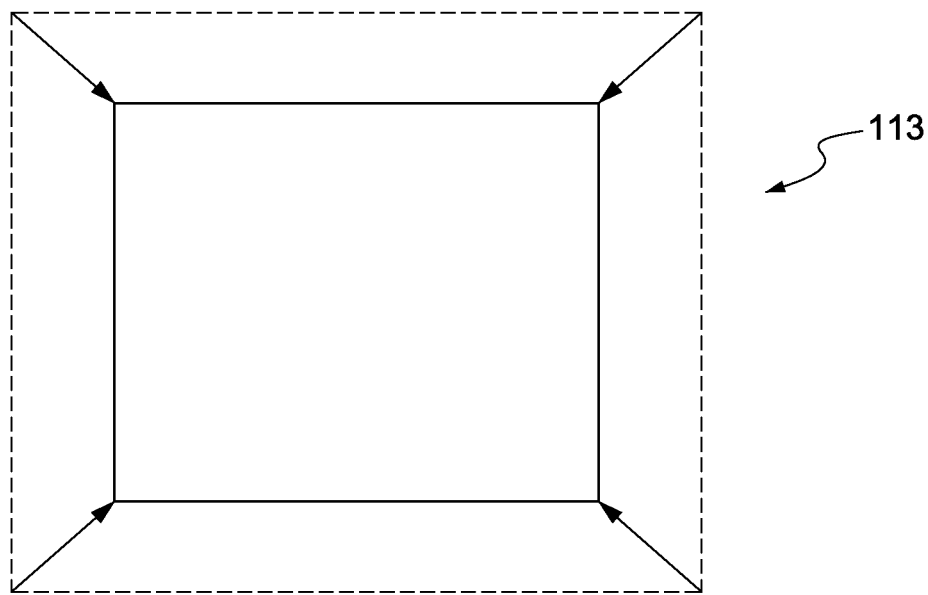
FIGS. 1E and 1F shows a difference in deformation of an upper portion and a lower portion of an interposer substrate with a cavity.
Figure 1F:
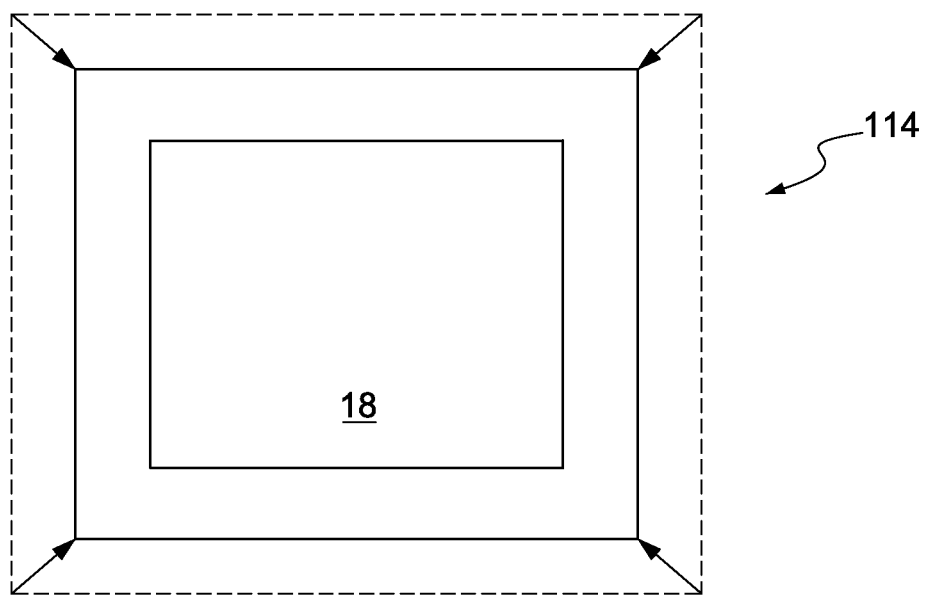

Further, the amount of shrinkage is related to area, so that the upper portion 113 and the lower portion 114 of the core layer 11 will shrink by different amounts over the same temperature range when the cavity 18 is present. FIGS. 1E and 1F are illustrative. FIG. 1E illustrates shrinkage of the upper portion 113 of the core layer 11 (i.e., the portion not including cavity 18), and FIG. 1F illustrates shrinkage of the lower portion 114 of the core layer 11 (i.e., where cavity 18 is present). In FIGS. 1E and 1F, shrinkage is indicated by the arrows from the dotted line (area at high temperature) to the solid line (area at low temperature). As can be seen by a comparison of FIGS. 1E and 1F, the area of upper portion 113 at high temperature is larger than the area of the lower portion 114 at high temperature, so that the degree of shrinkage is larger at the upper portion 113 than at the lower portion 114, and the warpage of the substrate will be in a concave shape.

To control the warpage of interposer substrate 10, the interposer substrate 10 includes a reinforcement structure. In the embodiment of FIGS. 1A to 1D, the reinforcement is in the form of a reinforcing layer 19 disposed within the cavity 18 and in physical contact with the core layer 11. The inclusion of the reinforcing layer 19 in the interposer substrate 10 is to enhance the strength of the structure of the interposer substrate 10; thus generally the modulus of rigidity of the reinforcing layer 19 is greater than the modulus of rigidity of the core layer 11 and the insulating layers 15 and 16. In one embodiment, the modulus of rigidity of a reinforcing layer 19 formed from copper can be about 110 gigaPascals (GPa), and the modulus of rigidity (or Young's modulus) of a core layer 11 formed from halogen free bismaleimide/triazine (BT) materials (e.g., from Mitsubishi Gas Chemical Company, such as GHPL-830NX (NX), GHPL-830 NS (NS) or GHPL-830NSF (NSF)) can be about 20 to 40 GPa. Some properties of NX, NS and NSF are shown in Table 2 below.

TABLE 3a

GHPL-830NS core layer type

|  | 3a1 | 3a2 | 3a3 | 3a4 | 3a5 | Unit |
|---|---|---|---|---|---|---|
| First conductive layer thickness |  |  | 18 |  |  | μm |
| Second conductive layer thickness |  |  | 18 |  |  | μm |
| First insulating layer thickness |  |  | 10 |  |  | μm |
| Second insulating layer thickness |  |  | 30 |  |  | μm |
| Core layer type |  |  | NS |  |  |  |
| Core layer thickness |  |  | 60 |  |  | μm |
| Height of the cavity |  |  | 18 |  |  | μm |
| Reinforcing layer thickness | 0 | 6 | 9 | 12 | 18 | μm |
| Warpage at 25° C. | −445 | −176 | −125 | −97 | −86 | μm |
| Warpage at 260° C. | 109 | −9 | −22 | −32 | −42 | μm |
| Total warpage | 554 | 167 | 103 | 65 | 44 | μm |
| Warpage severity | 100 | 30 | 19 | 12 | 8 | % |

As shown in Table 3a, column 3a2 (e.g., FIG. 1B), when the thickness of the reinforcing layer 19 occupies one third of the height of the cavity 18, the warpage severity decreases by approximately 70%. As shown in Table 3a, column 3a3 (e.g., FIG. 1D), when the thickness of the reinforcing layer 19 occupies about half of the height of the cavity 18, the warpage severity decreases by 81%. As shown in Table 3a, column 3a4 (e.g., FIG. 1A), when the thickness of the reinforcing layer 19 occupies about two thirds of the height of the cavity 18, the warpage severity decreases by 88%. As shown in Table 3a, column 3a5 (e.g., FIG. 1C), when the thickness of the reinforcing layer 19 completely occupies the height of the cavity 18, the warpage severity decreases by

TABLE 2

| Prepreg type | GHPL-830NX | GHPL-830NS | GHPL-830NSF |
|---|---|---|---|
| CTE (alpha 1) ppm/° C. (60-120° C.) | x, y = 14, z = 30 | x, y = 10, z = 22 | x, y = 3.5, z = 18 |
| CTE (alpha 1) ppm/° C.(240-280° C.) | x, y = 5, z = 140 | x, y = 3, z = 150 | x, y = 2, z = 90 |
| Glass transition (° C.) Tg (TMA) | TMA 200 | TMA 230 | TMA 270 |
| Young's modulus (Gpa) | 28 | 27 | 34 |

Generally, the material of the reinforcing layer 19 can be a metal or polymer whose modulus of rigidity is greater than the modulus of rigidity of the core layer 11 and the insulating layers 15 and 16. For example, the modulus of rigidity of the material of the reinforcing layer 19 can be at least about 50 GPa, at least about 60 GPa, at least about 70 GPa, at least about 80 GPa, at least about 90 GPa, at least about 100 GPa, or at least about 110 GPa. Because the reinforcing layer 19 within the cavity 18 of the interposer substrate 10 provides the rigidity at the center area of the core layer 11, and constrains the displacement of the lower portion 114 caused by the shrinkage of the core layer 11 when the temperature changes from high to low, the upper portion 113 with larger degree of shrinkage will not deform the lower portion 114 of the core layer 11. That is to say, warpage of the core layer 11 is reduced due to the existence of the reinforcing layer 19.

Tables 3a to 3d below show variation of the warpage of the interposer substrate 10 with different thicknesses of reinforcing layers within the cavity.

As can be seen in Table 3a, for core layer type NS and a cavity 18 height of 18 μm, as the thickness of the reinforcing layer 19 increases from 0 to 18 μm, the warpage severity of the interposer substrate 10 decreases by approximately 92% (i.e., from 100% to 8%).

92%. As can be seen, when the thickness of the reinforcing layer 19 is equal to the cavity 18 height, there is minimum warpage; however, if the cavity 18 is filled with the reinforcing layer 19, there is no space to accommodate another component of the PoP device. Therefore, there is trade-off between warpage severity and accommodating space.

As can be seen in Table 3b, for core layer type NX and a cavity 18 height of 18 μm, as the thickness of the reinforcing layer 19 increases from 0 to 18 μm, the warpage severity of the interposer substrate 10 decreases by approximately 88%. The difference between Table 3a and Table 3b lies in that the materials of the core layers are different: because the CTE of NX is greater than the CTE of NS, it is more difficult to compensate the imbalance of the NX type core layer. A thicker reinforcing layer 19 may be used to achieve the same minimization of warpage severity for the NX type.

TABLE 3b

GHPL-830NX core layer type

|  | 3b1 | 3b2 | 3b3 | 3b4 | 3b5 | Unit |
|---|---|---|---|---|---|---|
| First conductive layer thickness |  |  | 18 |  |  | μm |

TABLE 3b-continued

GHPL-830NX core layer type

|  | 3b1 | 3b2 | 3b3 | 3b4 | 3b5 | Unit |
|---|---|---|---|---|---|---|
| Second conductive layer thickness |  |  | 18 |  |  | μm |
| First insulating layer thickness |  |  | 10 |  |  | μm |
| Second insulating layer thickness |  |  | 30 |  |  | μm |
| Core layer type |  |  | NX |  |  |  |
| Core layer thickness |  |  | 60 |  |  | μm |
| Height of the cavity |  |  | 18 |  |  | μm |
| Reinforcing layer thickness | 0 | 6 | 9 | 12 | 18 | μm |
| Warpage at 25° C. | −289 | −147 | −137 | −130 | −122 | μm |
| Warpage at 260° C. | 166 | −12 | −33 | −49 | −66 | μm |
| Total warpage | 455 | 135 | 104 | 81 | 56 | μm |
| Warpage severity | 100 | 30 | 23 | 18 | 12 | % |

As can be seen in Table 3c, for a cavity 18 height of 30 μm and a core layer type NS, when the thickness of the reinforcing layer 19 increases from 0 to 30 μm, the warpage severity of the interposer substrate 10 decreases by approximately 88%. Because the height of the cavity in Table 3c is larger than the height of the cavity in Table 3a, while the total thickness of the core layer 11 remains the same (60 μm), it is more difficult to compensate the imbalance of the core layer 11. Thus, a thicker reinforcing layer 19 may be used to achieve the same minimization of warpage severity.

TABLE 3c

GHPL-830NS core layer type

|  | 3c1 | 3c2 | 3c3 | 3c4 | Unit |
|---|---|---|---|---|---|
| First conductive layer thickness |  | 18 |  |  | μm |
| Second conductive layer thickness |  | 18 |  |  | μm |
| First insulating layer thickness |  | 10 |  |  | μm |
| Second insulating layer thickness |  | 30 |  |  | μm |
| Core layer type |  | NS |  |  |  |
| Core layer thickness |  | 60 |  |  | μm |
| Height of the cavity |  | 30 |  |  | μm |
| Reinforcing layer thickness | 0 | 10 | 15 | 30 | μm |
| Warpage at 25° C. | −367 | −134 | −101 | −94 | μm |
| Warpage at 260° C. | 80 | −20 | −30 | −40 | μm |
| Total warpage | 447 | 114 | 71 | 54 | μm |
| Warpage severity | 100 | 26 | 16 | 12 | % |

As can be seen in Table 3d, for a cavity 18 height of 30 μm and a core layer type NX, when the thickness of the reinforcing layer 19 increases from 0 to 30 μm, the warpage severity of the interposer substrate 10 decreases by approximately 88%.

TABLE 3d

GHPL-830NX core layer type

|  | 3d1 | 3d2 | 3d3 | 3d4 | Unit |
|---|---|---|---|---|---|
| First conductive layer thickness |  | 18 |  |  | μm |
| Second conductive layer thickness |  | 18 |  |  | μm |
| First insulating layer thickness |  | 10 |  |  | μm |
| Second insulating layer thickness |  | 30 |  |  | μm |
| Core layer type |  | NX |  |  |  |
| Core layer thickness |  | 60 |  |  | μm |
| Height of the cavity |  | 30 |  |  | μm |
| Reinforcing layer thickness | 0 | 10 | 15 | 30 | μm |
| Warpage at 25° C. | −301 | −146 | −136 | −114 | μm |
| Warpage at 260° C. | 128 | −33 | −47 | −64 | μm |
| Total warpage | 429 | 113 | 89 | 50 | μm |
| Warpage severity | 100 | 26 | 21 | 12 | % |

As seen in Tables 3a-3d, warpage of the interposer substrate 10 decreases when the thickness of the reinforcing layer 19 increases.

Figure 2A:
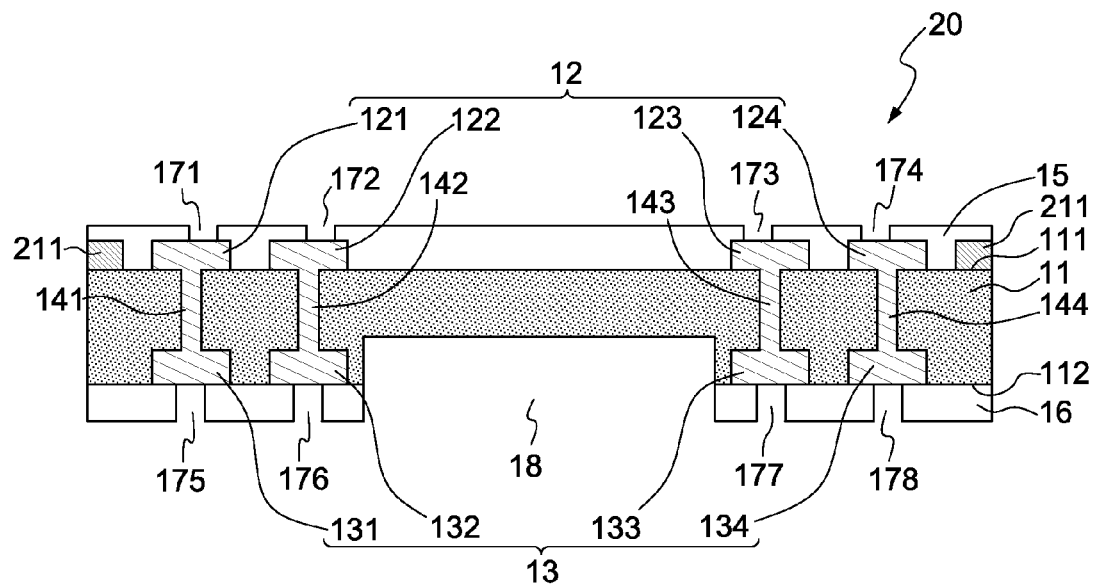
FIGS. 2A, 2B and 2C show interposer substrates with reinforcing rings according to an embodiment of the present disclosure.
Figure 2B:
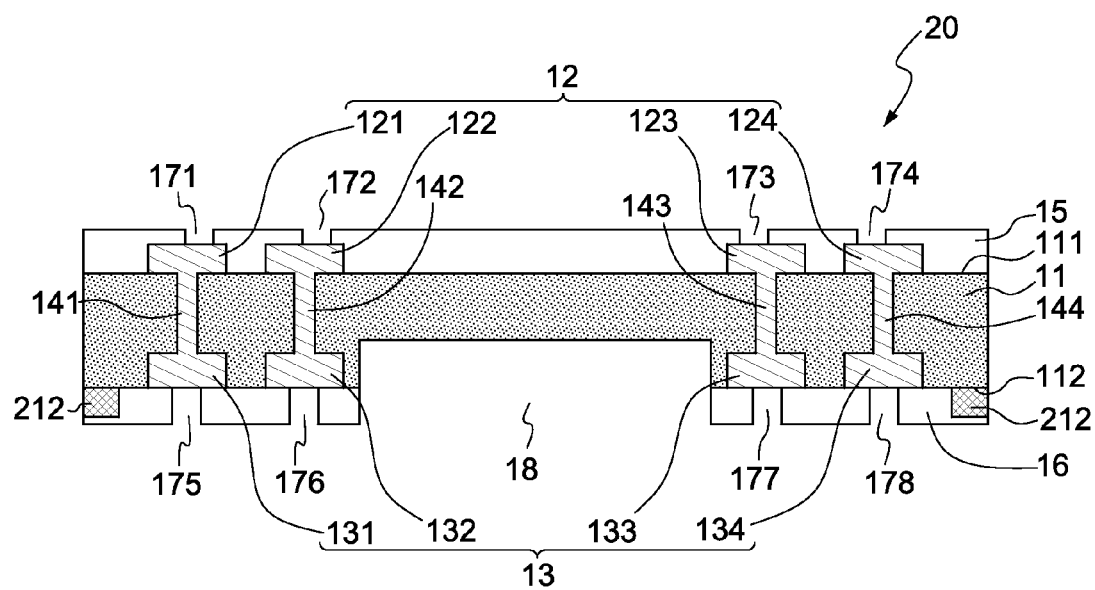
Figure 2C:
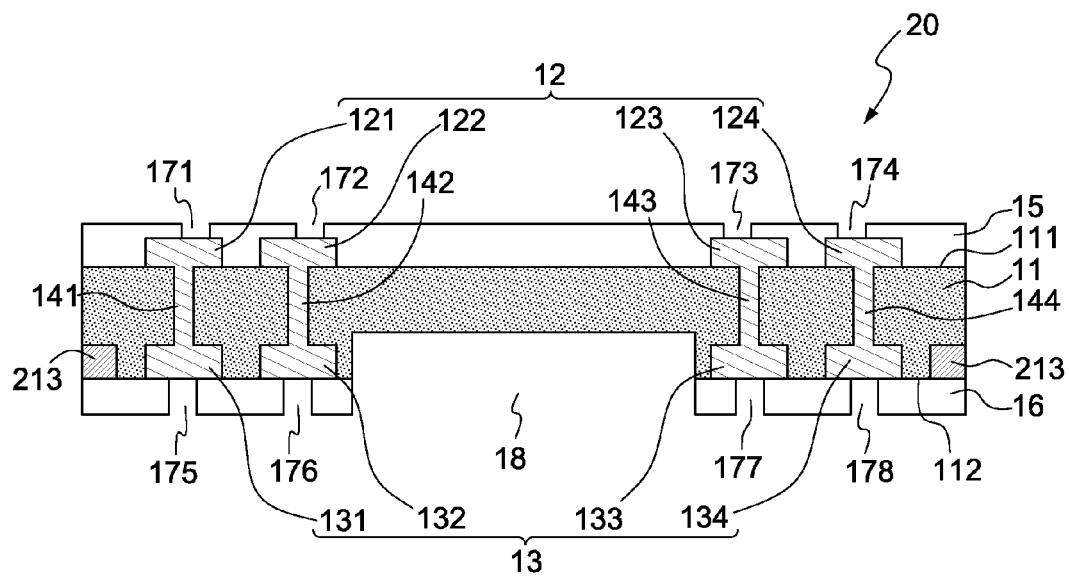

Referring to FIG. 2A through FIG. 2C, cross-sectional views of a second embodiment of the present disclosure are shown. To control the warpage of an interposer substrate 20, the interposer substrate 20 includes a reinforcement structure in the form of a ring 211. The material of the ring can be selected from materials whose modulus of rigidity is greater than the core layer 11 and the insulating layers 15 and 16, such as copper or aluminum. The core layer 11 has a first surface 111 and a second surface 112 opposite the first surface 111. As shown in FIG. 2A, the ring 211 is formed on the first surface 111. The ring may be additionally or alternatively formed on the second surface 112. For example, in FIG. 2B, a ring 212 is formed on the second surface 112. Further, the ring 211 may be embedded into the core layer 11. For example, in FIG. 2C, a ring 213 is formed adjacent to the second surface 112 and embedded in the core layer 11.

Figure 2D:
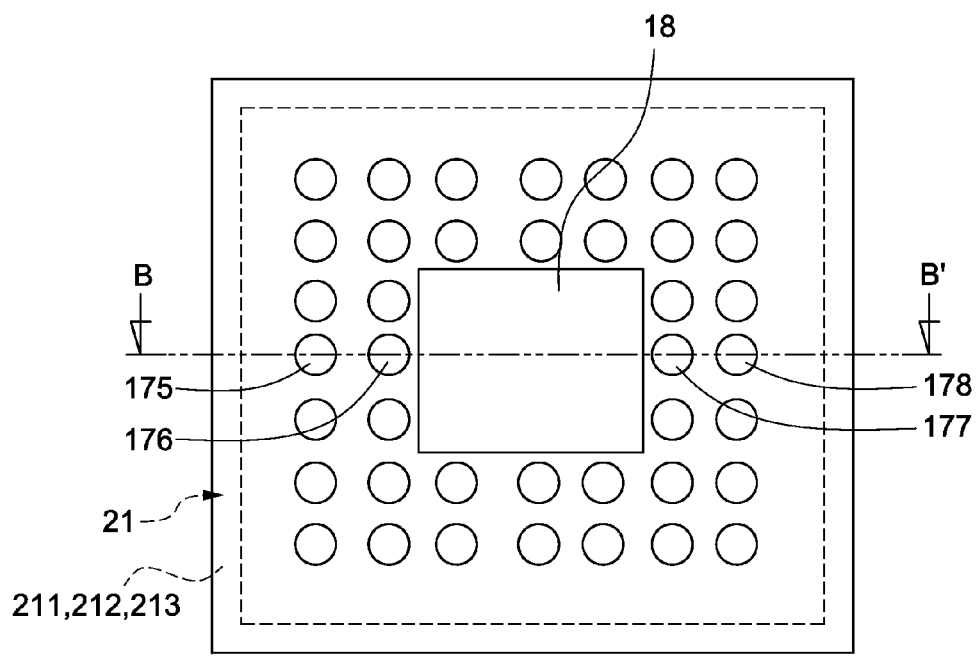
FIG. 2D shows a bottom view of an interposer substrate with a reinforcing ring according to an embodiment of the present disclosure.
Figure 3A:
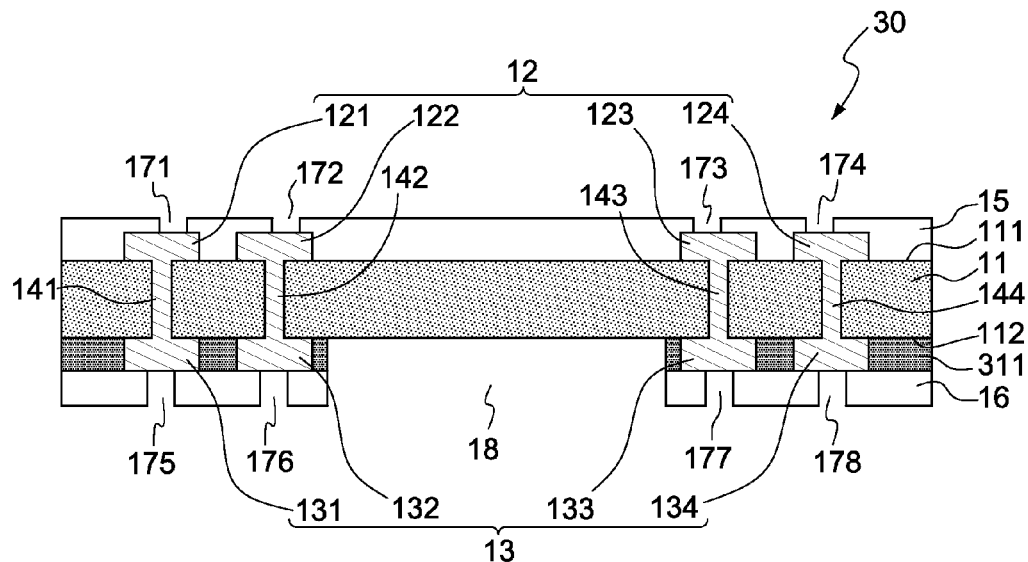
FIGS. 3A, 3B, 3C, 3D and 3E show interposer substrates with reinforcing core layers according to an embodiment of the present disclosure.
Figure 3B:
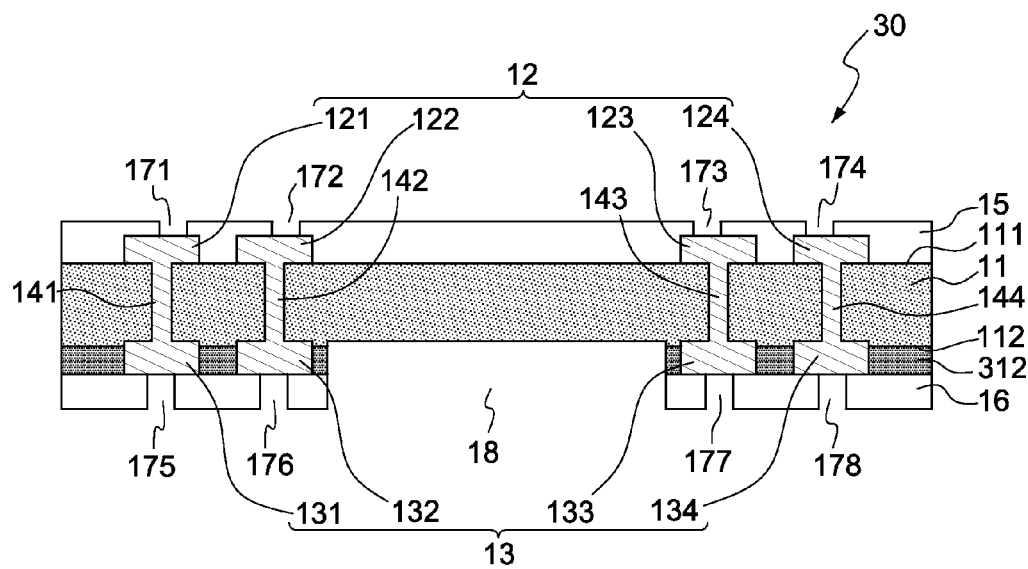
Figure 3C:
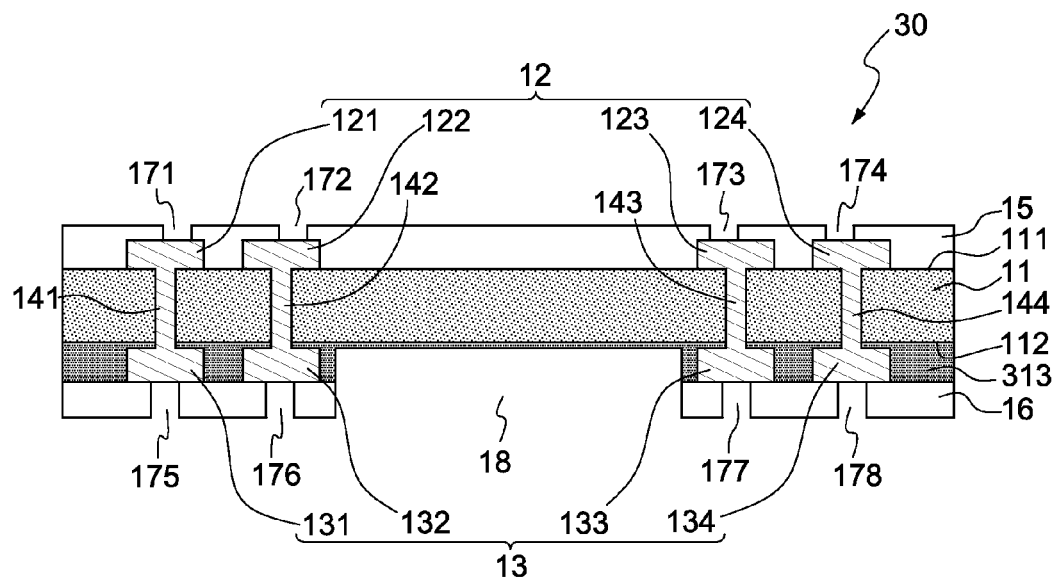
Figure 3D:
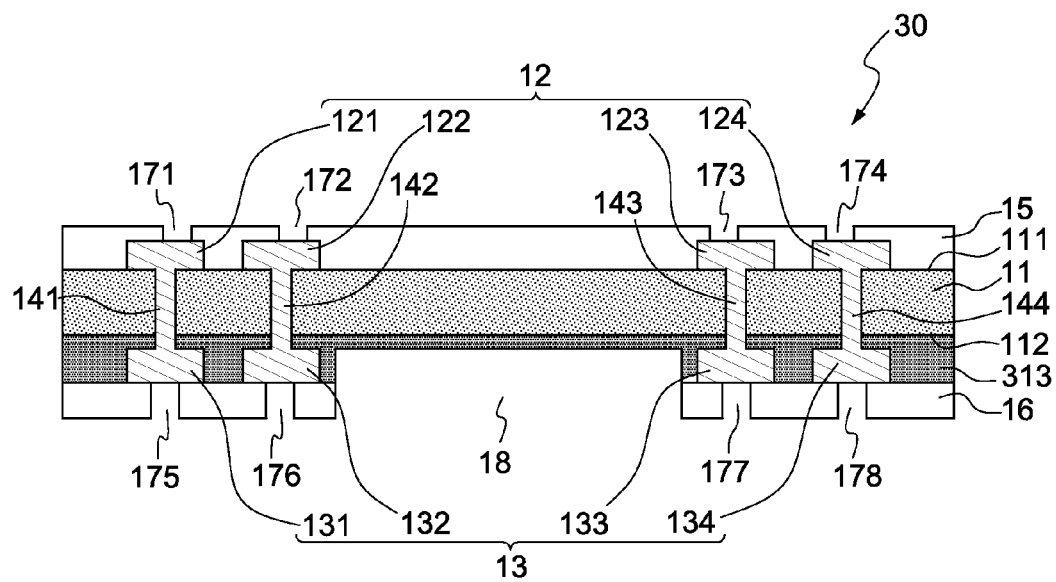
Figure 3E:
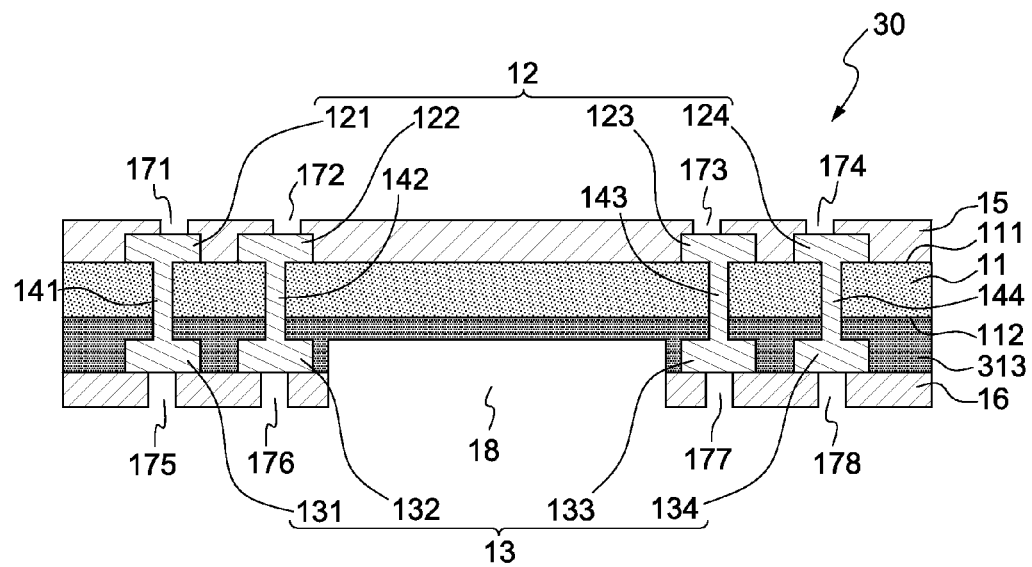

FIG. 2D shows a bottom view (perspective view) of the interposer substrate 20 with a ring 21. By way of explanation, FIGS. 2A to 2C are cross-sectional views of the interposer substrate 20 taken along a line BB' as shown in FIG. 2D, and ring 21 corresponds to ring 211, 212 or 213 in FIGS. 2A to 2C. As can be seen in FIG. 2D, the ring 21 is formed around the cavity 18 so as to control the deformation caused by the cavity 18.

Table 4a shows variation of the warpage of the interposer substrate 20 with different locations of the ring 21 (e.g., rings 211, 212, 213). The ring 21 provides the rigidity of the core layer 11, particularly the rigidity of the peripheral portion of the core layer 11, to resist the shrinkage of the core layer 11 at different locations in the interposer substrate 20 when the temperature changes from high to low. As shown in Table 4a, column 4a2 (e.g., FIG. 2A), when a ring 211 is formed on the first surface 111, the warpage severity decreases by approximately 33%. As shown in Table 4a, column 4a3 (e.g., FIG. 2C), when a ring 213 is formed adjacent to the second surface 112 and embedded into the core layer 11, the warpage severity decreases by approximately 27%. As shown in Table 4a, column 4a4 (e.g., FIG. 2B), when a ring 212 is formed on the second surface 112, the warpage severity decreases by approximately 38%. Therefore, when the location of the ring 21 moves closer to the second surface 112, the warpage severity of the interposer substrate 20 decreases.

TABLE 4a

|  | 4a1 | 4a2 | 4a3 | 4a4 | Unit |
|---|---|---|---|---|---|
| First conductive layer thickness |  | 18 |  |  | μm |
| Second conductive layer thickness |  | 18 |  |  | μm |
| First insulating layer thickness |  | 10 |  |  | μm |
| Second insulating layer thickness |  | 30 |  |  | μm |
| Core layer type |  | NX |  |  |  |
| Core layer thickness |  | 60 |  |  | μm |

TABLE 4a-continued

|  | 4a1 | 4a2 | 4a3 | 4a4 | Unit |
|---|---|---|---|---|---|
| Height of the cavity |  |  | 18 |  | μm |
| Location of the ring | No ring | First surface | Embedded | Second surface |  |
| Warpage at 25° C. | −289 | −201 | −192 | −108 | μm |
| Warpage at 260° C. | 166 | 104 | 140 | 173 | μm |
| Total warpage | 455 | 305 | 332 | 281 | μm |
| Warpage severity | 100 | 67 | 73 | 62 | % |

In the embodiments illustrated in FIGS. 2A-2D, the ring 21 is located adjacent to a peripheral edge of the core layer 11; however, the ring 21 may be positioned differently.

Referring to FIG. 3A through FIG. 3E, cross-sectional views of a third embodiment of the present disclosure are shown. In this embodiment, core layer 11 is a first of two core layers, where the reinforcement structure is a second core layer 311 below and in contact with the first core layer 11 in an interposer substrate 30. The material of the second core layer 311 can be selected from materials whose modulus of rigidity and glass transition temperature are greater than the first core layer 11 and the insulating layers 15 and 16. For example, the material of the first core layer may be NX and the material of the second core layer may be NS. In the embodiment illustrated in FIG. 3A, the thickness of the second core layer 311 is approximately the same as that of the second conductive layer 13. In other embodiments, the thickness of the second core layer 311 may be smaller or greater than the thickness of the second conductive layer 13. For example, in FIG. 3B, the thickness of the second core layer 312 is illustrated as being less than that of the second conductive layer 13, whereas in FIGS. 3C, 3D and 3E, the thickness of the second core layer 313 is illustrated as being greater than the thickness of the second conductive layer 13.

Tables 5a and 5b show variation of the warpage of the interposer substrate 30 for different thickness ratios between the first core layer 11 and the second core layer 311. The height of the cavities in FIGS. 3A to 3E is 18 μm. As shown in Table 5a, column 5a2 (e.g., FIG. 3B), when a thickness of the first core layer is 45 μm and a thickness of the second core layer is 15 μm, the warpage severity decreases by approximately 32%. As shown in Table 5a, column 5a3 (e.g., FIG. 3A), when a thickness of the first core layer 11 is 42 μm and a thickness of the second core layer 311 is 18 μm, the warpage severity decreases by approximately 33%. As shown in Table 5a, column 5a4 (e.g., FIG. 3C), when a thickness of the first core layer 11 is 39 μm and a thickness of the second core layer 311 is 21 μm, the warpage severity decreases by approximately 13%.

TABLE 5a

|  | 5a1 | 5a2 | 5a3 | 5a4 | Unit |
|---|---|---|---|---|---|
| First conductive layer thickness |  |  | 18 |  | μm |
| Second conductive layer thickness |  |  | 18 |  | μm |
| First insulating layer thickness |  |  | 10 |  | μm |
| Second insulating layer thickness |  |  | 30 |  | μm |
| Core layer type |  |  | NX/NSF |  |  |
| Core layer thickness |  |  | 60 |  | μm |
| First/Second core layer thickness | — | 45/15 | 42/18 | 39/21 | μm |
| Height of the cavity |  |  | 18 |  | μm |
| Warpage at 25° C. | −445 | −206 | −205 | −309 | μm |
| Warpage at 260° C. | 109 | 169 | 167 | 175 | μm |
| Total warpage | 554 | 375 | 372 | 484 | μm |
| Warpage severity | 100 | 68 | 67 | 87 | % |

As shown in Table 5b, column 5b2 (e.g., FIG. 3D), when a thickness of the first core layer 11 is 35 μm and a thickness of the second core layer 311 is 25 μm, the warpage severity decreases by approximately 25%. As shown in Table 5b, column 5b3 (e.g., FIG. 3E), when a thickness of the first core layer 11 is 30 μm and a thickness of the second core layer 311 is 30 μm, the warpage severity decreases by approximately 22%.

TABLE 5b

|  | 5b1 | 5b2 | 5b3 | Unit |
|---|---|---|---|---|
| First conductive layer thickness |  | 18 |  | μm |
| Second conductive layer thickness |  | 18 |  | μm |
| First insulating layer thickness |  | 10 |  | μm |
| Second insulating layer thickness |  | 30 |  | μm |
| Core layer type |  | NX/NSF |  |  |
| Core layer thickness |  | 60 |  | μm |
| First/Second core layer thickness | — | 35/25 | 30/30 | μm |
| Height of the cavity |  | 30 |  | μm |
| Warpage at 25° C. | −367 | −206 | −214 | μm |
| Warpage at 260° C. | 80 | 131 | 132 | μm |
| Total warpage | 447 | 337 | 346 | μm |
| Warpage severity | 100 | 75 | 78 | % |

As can be seen, when a thickness of the first core layer 11 is 42 μm and a thickness of the second core layer 311 is 18 μm, which is substantially the same as the height of the cavity 18, the warpage of the interposer substrate is minimized. That is, increasing the thickness of the second core layer 311 greater than the height of the cavity 18 may lead to deformation of the second core layer 311, and thus the warpage severity increases. Therefore, the thickness of the second core layer 311 should be carefully controlled. A second core layer 311 with a higher modulus of rigidity can resist the deformation of the first core layer 11 with a lower modulus of rigidity. Additionally, a second core layer 311 with a higher glass transition temperature is less sensitive to a variance of temperature than a first core layer 11 with a lower glass transition temperature.

Figure 4A:
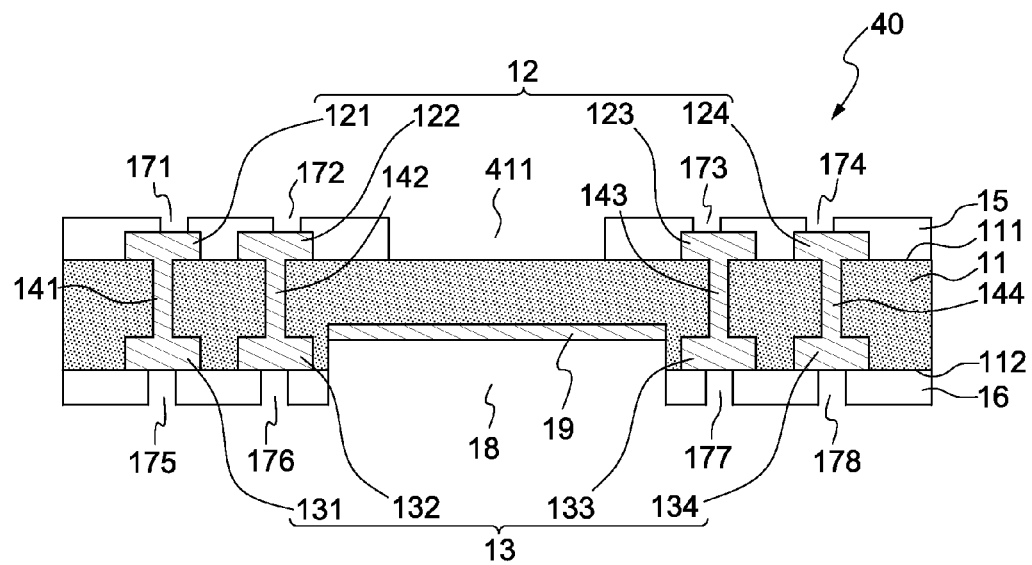
FIGS. 4A, 4B and 4C show interposer substrates with recesses according to an embodiment of the present disclosure.
Figure 4B:
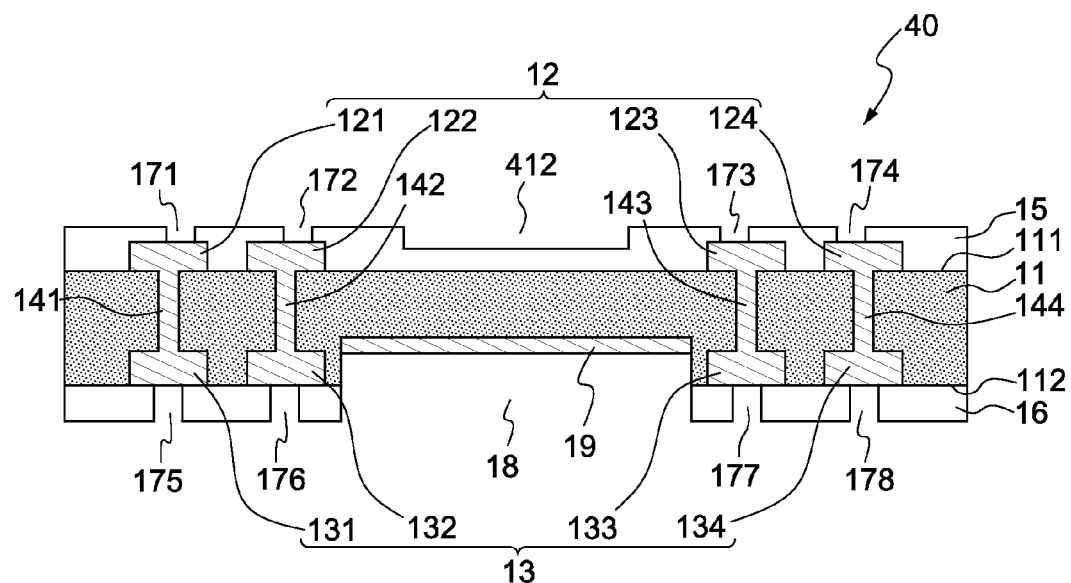
Figure 4C:
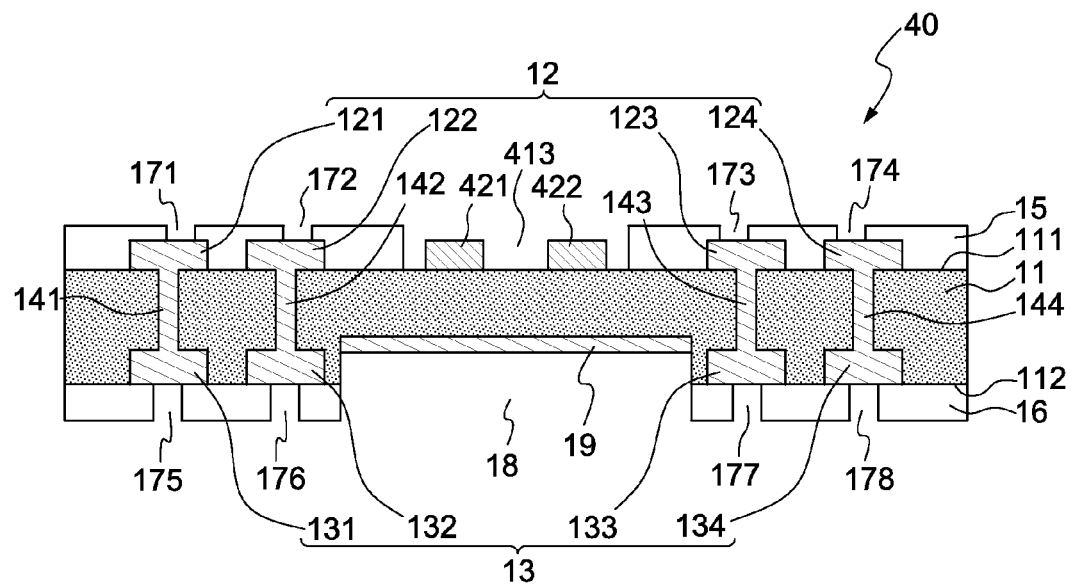

Referring to FIG. 4A through FIG. 4C, cross-sectional views of a fourth embodiment of the present disclosure are shown. Similar to the embodiment of FIGS. 1A to 1D, the interposer substrate 40 includes a reinforcement structure in the form of a reinforcing layer 19 within a cavity 18. The interposer substrate 40 further includes another reinforcement structure in the form of a recess 411 formed in the first insulating layer 15 at a location above the cavity 18, wherein the size of the recess 411 is not greater than the size of the cavity 18. In the embodiment of FIG. 4A, the recess 411 is deep enough such that the first core layer 11 is partially exposed in the recess 411. In contrast, in FIG. 4B, the first core layer 11 is not exposed in a recess 412. The recess 411 shown in FIG. 4A may include one or more traces for routing, shown as traces 421 and 422 in the recess 413 of FIG. 4C.

Table 6a shows variation of the warpage of the interposer substrate 40 with and without a recess 411 formed in the first insulating layer 15. A total warpage of an interposer substrate with a cavity 18 is 455 μm (column 6a1). As was shown in Table 4a, column 4a2 (reproduced in column 6a2), when a ring 211 for reinforcing is formed on the first surface 111, the total warpage of an interposer substrate is 305 μm. By further introducing a recess 411 in the first insulating layer 15, the total warpage of the interposer substrate 40 becomes 146 μm (column 6a3). As was shown in Table 4a, column 4a4 (reproduced in column 6a4), when a ring 212 for reinforcing is formed on the second surface 112, the total warpage of an interposer substrate is 281 µm. By further introducing a recess 411 in the first insulating layer 15, the total warpage of an interposer substrate becomes 106 µm (column 6a5). As was shown in Table 5a, column 5a3 (reproduced in column 6a6), when a second core layer 311 for reinforcing is introduced in contact with the first core layer 11 in the interposer substrate 30, the total warpage of an interposer substrate is 372 µm. By further introducing a recess 411 in the first insulating layer 15, the total warpage of an interposer substrate 40 becomes 228 µm (column 6a7).

TABLE 6a

|  | 6a1 | 6a2 | 6a3 | 6a4 | 6a5 | 6a6 | 6a7 | Unit |
|---|---|---|---|---|---|---|---|---|
| First conductive layer thickness |  |  |  | 18 |  |  |  | µm |
| Second conductive layer thickness |  |  |  | 18 |  |  |  | µm |
| First insulating layer thickness |  |  |  | 10 |  |  |  | µm |
| Second insulating layer thickness |  |  |  | 30 |  |  |  | µm |
| Core layer type |  |  | NX |  |  | NX/NSF |  |  |
| Core layer thickness |  |  |  | 60 |  |  |  | µm |
| Height of the cavity |  |  |  | 18 |  |  |  | µm |
| Location of ring | No ring | First surface | First surface | Second surface | Second surface | No ring | No ring |  |
| Recess | No | No | Yes | No | Yes | No | Yes |  |
| Warpage at 25° C. | −289 | −201 | −52 | −108 | 50 | −205 | −98 | µm |
| Warpage at 260° C. | 166 | 104 | 94 | 173 | 156 | 167 | 130 | µm |
| Total warpage | 455 | 305 | 146 | 281 | 106 | 372 | 228 | µm |
| Warpage severity | 100 | 67 | 32 | 62 | 23 | 82 | 50 | % |

As seen by the results in Table 6, introducing a recess 411 in the first insulating layer significantly reduces warpage: as the area of the upper portion of the core layer 11 is reduced, the degree of shrinkage toward the center of the core layer is also reduced. Additionally, one or more traces 421 and 422 (e.g., FIG. 4C), which are formed with materials with higher modulus of rigidity than the first insulating layer 15, can be formed above the cavity 18 to increase the rigidity of the upper portion of the core layer 11, further reducing warpage as the temperature varies.

Figure 5:
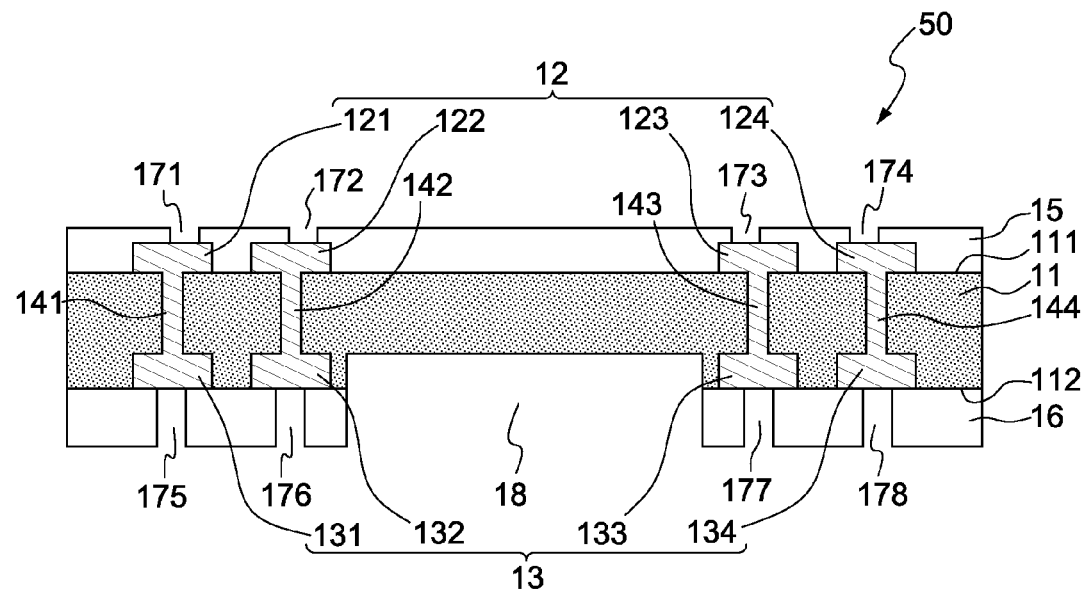
FIG. 5 shows an interposer substrate with a reinforcing insulating layer according to an embodiment of the present disclosure.

Referring to FIG. 5, a cross-sectional view of a fifth embodiment of the present disclosure is shown. To control the warpage of an interposer substrate 50, a ratio of a thickness of the first insulating layer 15 to a thickness of the second insulating layer 16 is controlled to be less than one. The shrinkage occurring in the first insulating layer 15 and the second insulating layer 16 with different thicknesses compensates for the shrinkage of the core layer 11.

Figure 6:
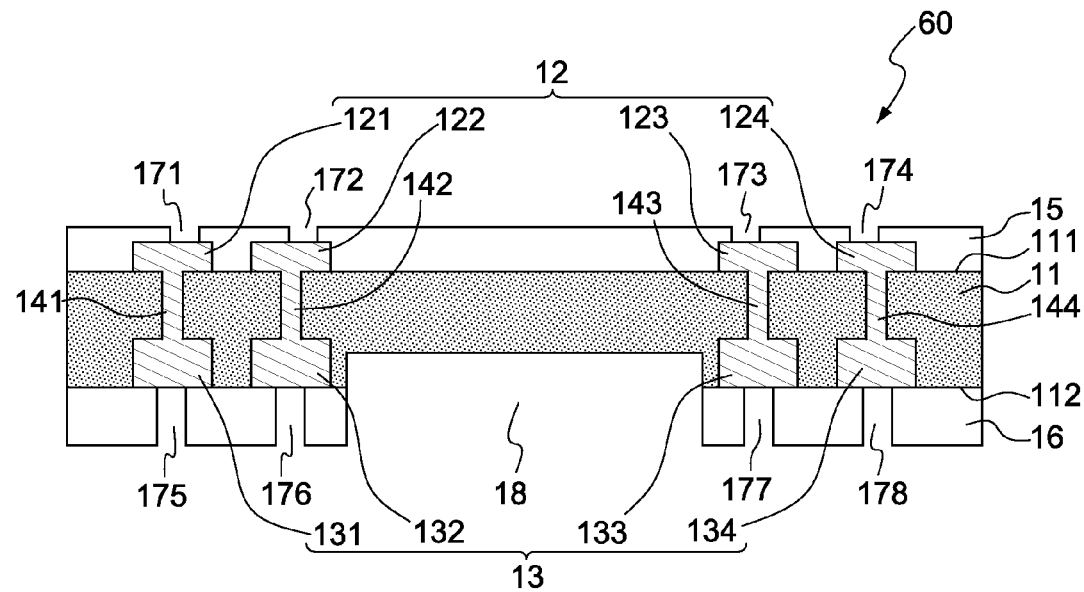
FIG. 6 shows an interposer substrate with a reinforcing conductive layer according to an embodiment of the present disclosure.

Referring to FIG. 6, a cross-sectional view of a sixth embodiment of the present disclosure is shown. To control the warpage of an interposer substrate 60, a ratio of a thickness of the first conductive layer 12 to a thickness of the second conductive layer 13 is controlled to be less than one. The second conductive layer 13 with a greater thickness provides rigidity to resist deformation caused by the imbalanced design of the interposer substrate with a cavity 18.

Table 7a shows variation of the warpage of interposer substrates such as the interposer substrates 50 (FIG. 5) and 60 (FIG. 6), with variation of the ratio of the thickness of the first insulating layer 15 to the thickness of the second insulating layer 16, variation of the ratio of the thickness of the first conductive layer 12 to the thickness of the second conductive layer 13, and variation of the material of the core layer 11. As shown in Table 7a, column 7a1, when thicknesses of the first conductive layer 12 and the second conductive layer 13 are both 18 µm, and thicknesses of the first insulating layer 15 and the second insulating layer 16 are both 20 µm, the total warpage of an interposer substrate is 1297 µm. As shown in Table 7a, column 7a2 (e.g., FIG. 5), when a thickness of the first insulating layer 15 is 10 µm and a thickness of the second insulating layer 16 is 30 µm, the total warpage of the interposer substrate becomes 554 µm. Further, by changing the material of the core layer 11 from NS to NX, the total warpage of the interposer substrate can be reduced to 455 µm (column 7a3). Additionally, by changing a thickness of the first conductive layer 12 to 16 µm and changing a thickness of the second conductive layer 13 to 25 µm (e.g., FIG. 6), the total warpage of the interposer substrate can be further reduced to 346 µm (column 7a4).

As seen by the results in Table 7a, the warpage severity reduces when the ratio of a thickness of the first insulating layer 15 to a thickness of the second insulating layer 16 is controlled to less than one, when the ratio of a thickness of the first conductive layer 12 to a thickness of the second conductive layer 13 is controlled to less than one, or when the material of core layer 11 is changed from NS to NX.

TABLE 7a

|  | 7-1 | 7-2 | 7-3 | 7-4 | Unit |
|---|---|---|---|---|---|
| First conductive layer thickness | 18 | 18 | 18 | 16 | µm |
| Second conductive layer thickness | 18 | 18 | 18 | 25 | µm |
| First insulating layer thickness | 20 | 10 | 10 | 10 | µm |
| Second insulating layer thickness | 20 | 30 | 30 | 30 | µm |
| Core layer type | NS |  | NX |  |  |
| Core layer thickness |  | 60 |  |  | µm |
| Height of the cavity |  | 18 |  |  | µm |
| Warpage at 25° C. | −1191 | −445 | −289 | −278 | µm |
| Warpage at 260° C. | 106 | 109 | 166 | 149 | µm |
| Total warpage | 1297 | 554 | 455 | 346 | µm |
| Warpage severity | 100 | 68 | 67 | 87 | % |

Figure 7A:
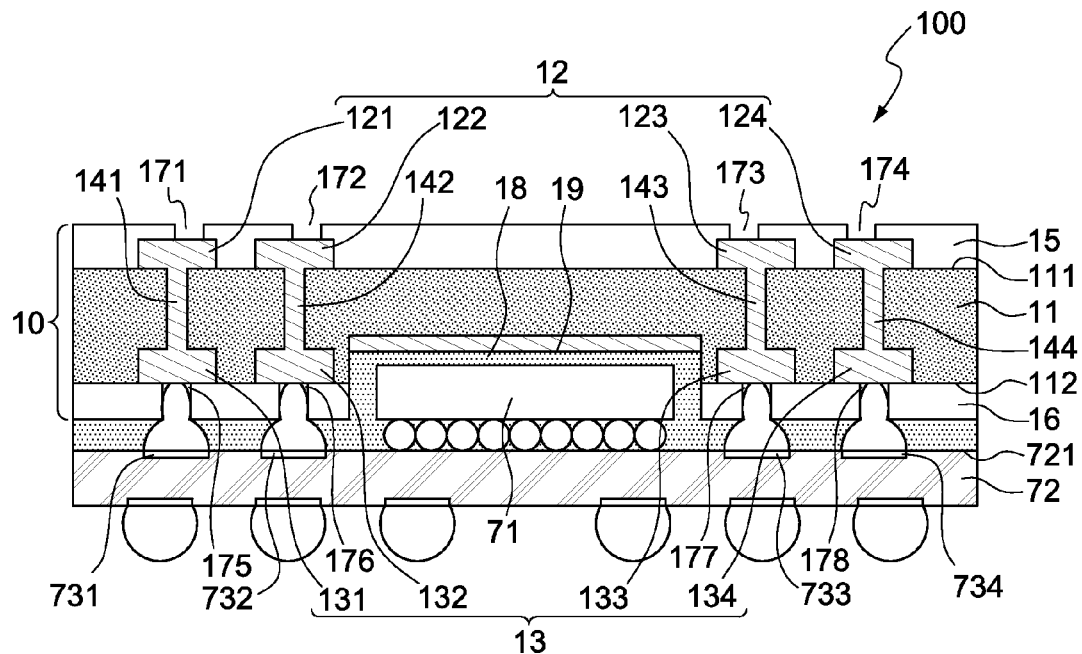
FIGS. 7A, 7B and 7C show a semiconductor structure with an interposer substrate according to the embodiments of FIGS. 1A, 2B and 3A.
Figure 7B:
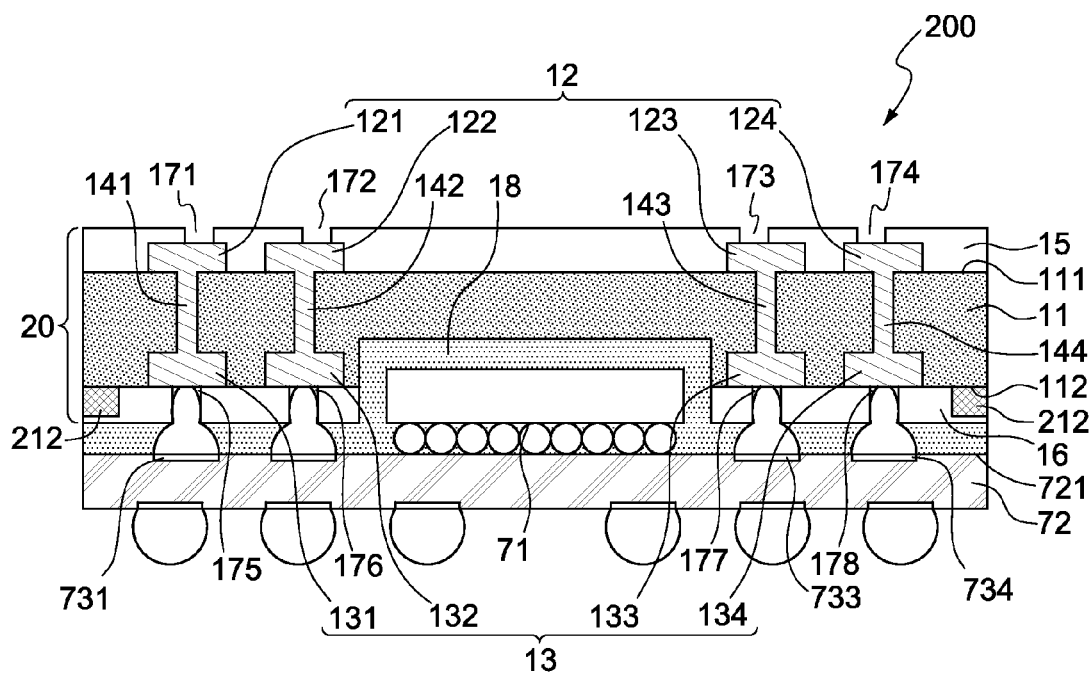
Figure 7C:
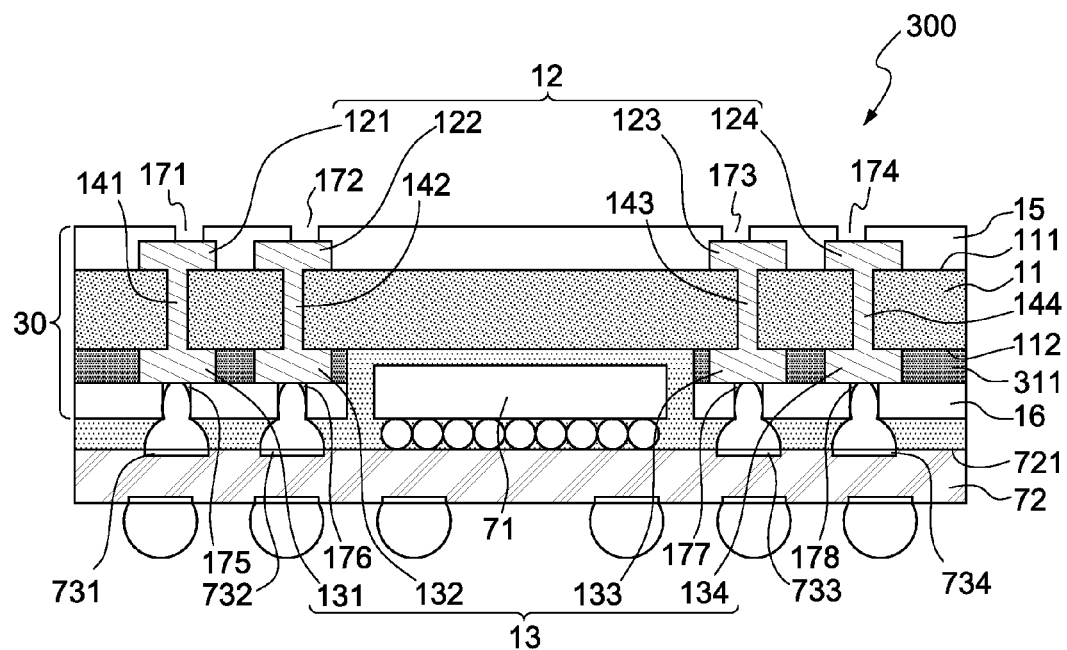

FIGS. 7A, 7B and 7C show semiconductor structures that include warpage-reducing interposer substrates in accordance with this disclosure. In FIGS. 7A, 7B and 7C, each of semiconductor structures 100, 200 and 300 comprises: a base substrate 72 having a first surface 721 including a plurality of base substrate pads 731, 732, 733 and 734 formed thereon; an interposer substrate 10 comprising: a first core layer 11, a first conductive layer 12 on a first side of the interposer substrate 10 and comprising a plurality of first pads 121, 122, 123 and 124; a second conductive layer 13 on a second side of the interposer substrate 10 and comprising a plurality of second pads 131, 132, 133 and 134, a plurality of conductive vias 141, 142, 143 and 144 electrically connecting the first conductive layer 12 and the second conductive layer 13, a cavity 18 formed in the interposer substrate 10, and a reinforcement structure for the interposer substrate 10. At least one of the first pads 121, 122, 123 and 124 or second pads 131, 132, 133 and 134 is electrically coupled to at least one of the plurality of base substrate pads 731, 732, 733 and 734. A semiconductor device 71 is positioned generally within the cavity 18 between the base substrate 72 and the interposer substrate 10.

The reinforcement structure for the interposer substrate 10 may be a reinforcing layer 19 disposed within the cavity 18 and physically in contact with the core layer 11 in accordance with an embodiment of the present disclosure. Such a reinforcing layer 19 is illustrated in FIG. 7A, and may be implemented as described with respect to FIGS. 1A to 1D.

The reinforcement structure for the interposer substrate 10 may be a ring 212 in the interposer substrate 20 in accordance with another embodiment of the present disclosure. Such a ring 212 is illustrated in FIG. 7B, and may be implemented as described with respect to FIG. 2B. In other embodiments, a ring 211 (e.g., FIG. 2A) or a ring 213 (e.g., FIG. 2C) may be additionally or alternatively be implemented.

The reinforcement structure for the interposer substrate 10 may be a second core layer 311 below and in contact with the first core layer 11 in the interposer substrate 30 in accordance with another embodiment of the present disclosure. Such a second core layer 311 is illustrated in FIG. 7C, and may be implemented as described with respect to FIG. 3A.

Figure 8A:
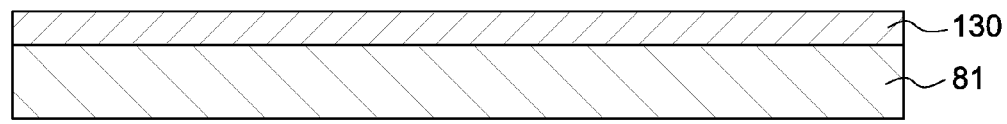
FIGS. 8A, 8B, 8C, 8D, 8E and 8F show a fabricating method to form the interposer substrate of FIG. 1A according to an embodiment of the present disclosure.
Figure 8B:
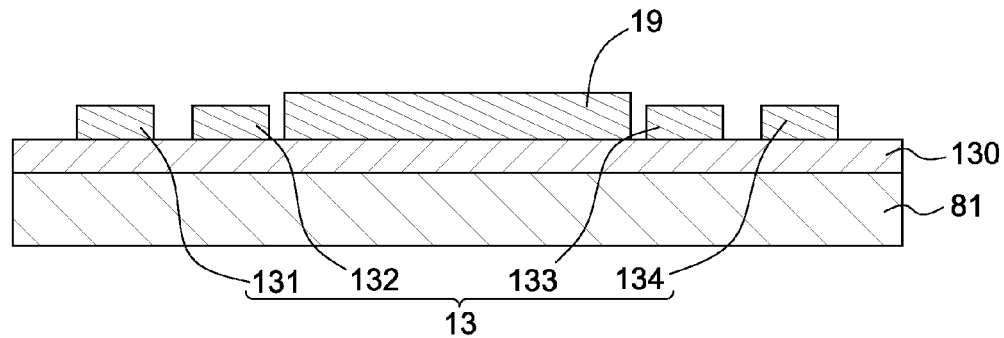
Figure 8C:
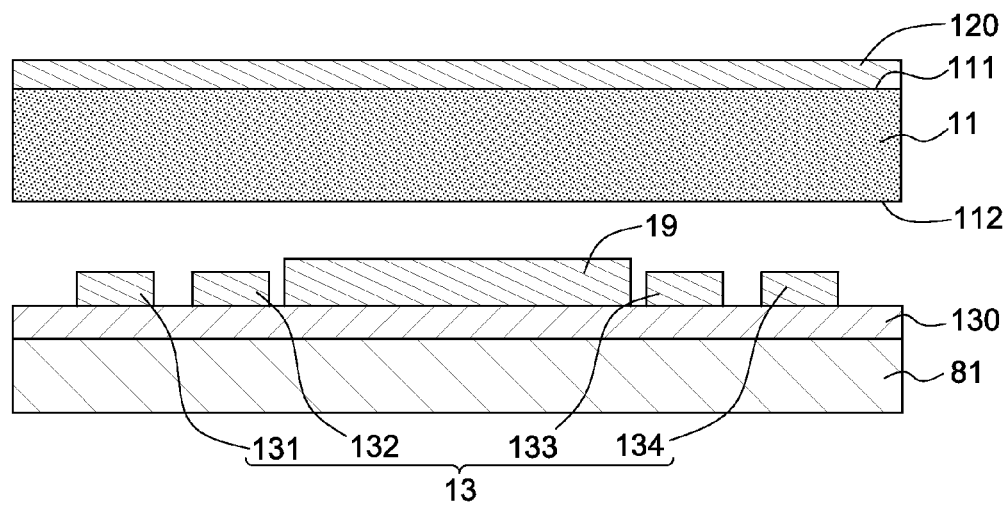
Figure 8D:
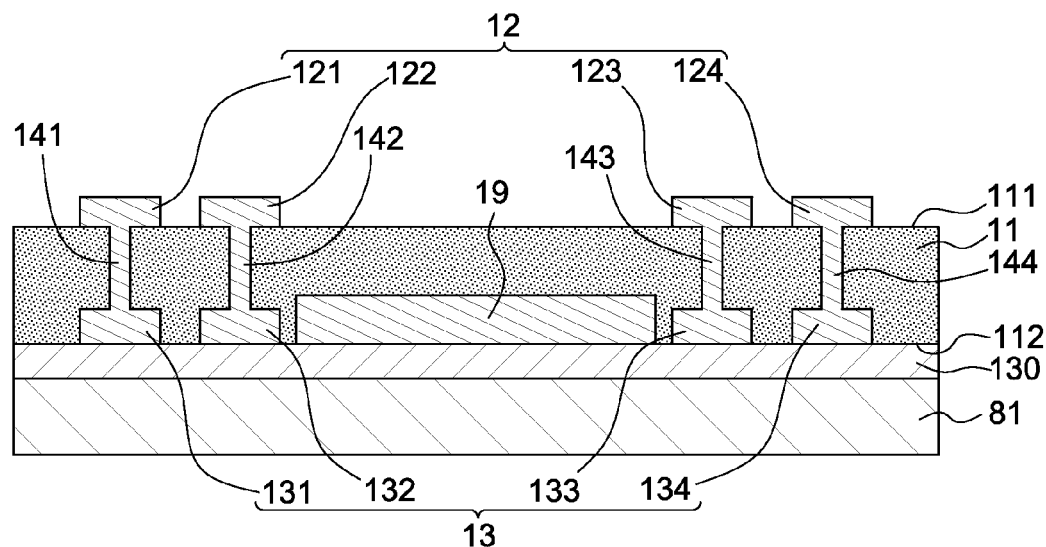

FIG. 8A through FIG. 8F shows a fabricating method to form the interposer substrate 10 of FIG. 1. As indicated in FIG. 8A, a carrier 81 is provided and a metal layer 130 is positioned on a top surface of the carrier 81. As indicated in FIG. 8B, a protrusion 19 and a conductive layer 13 (i.e., the second conductive layer 13) may be formed on the metal layer 130, for example by a plating technique. As shown in FIGS. 8C-8D, a core layer 11 with a metal layer 120 thereon is formed on the protrusion 19 and the carrier 81 so that the protrusion 19 and the conductive layer 13 are embedded in the core layer. In an embodiment, the core layer 11 may contain two or more sub core layers. In one embodiment, the core layer 11 comprises a first sub core layer and a second sub core layer, wherein the ratio of the modulus of rigidity of the first sub core layer to the modulus of rigidity of the second sub core layer is less than one.

Figure 8E:
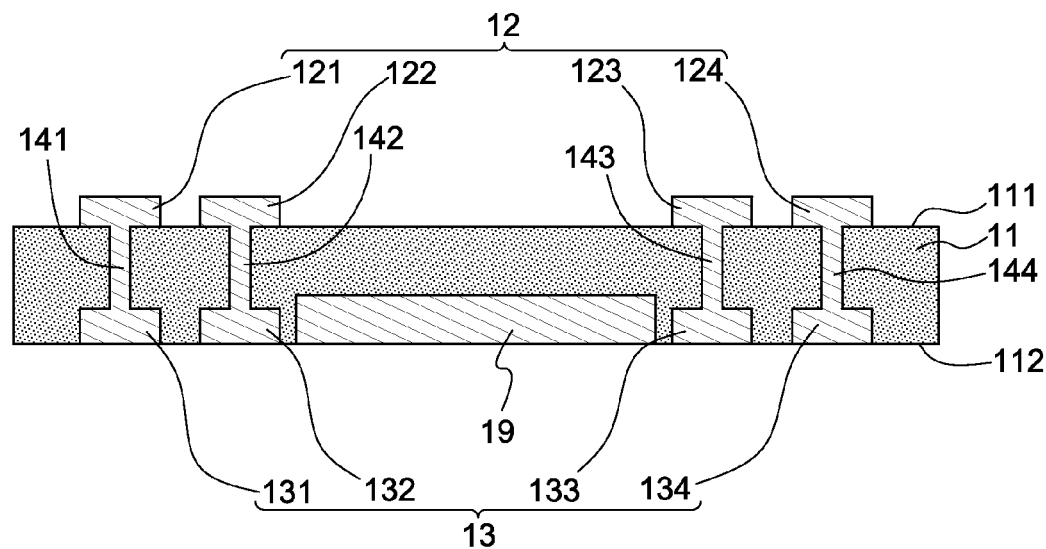
Figure 8F:
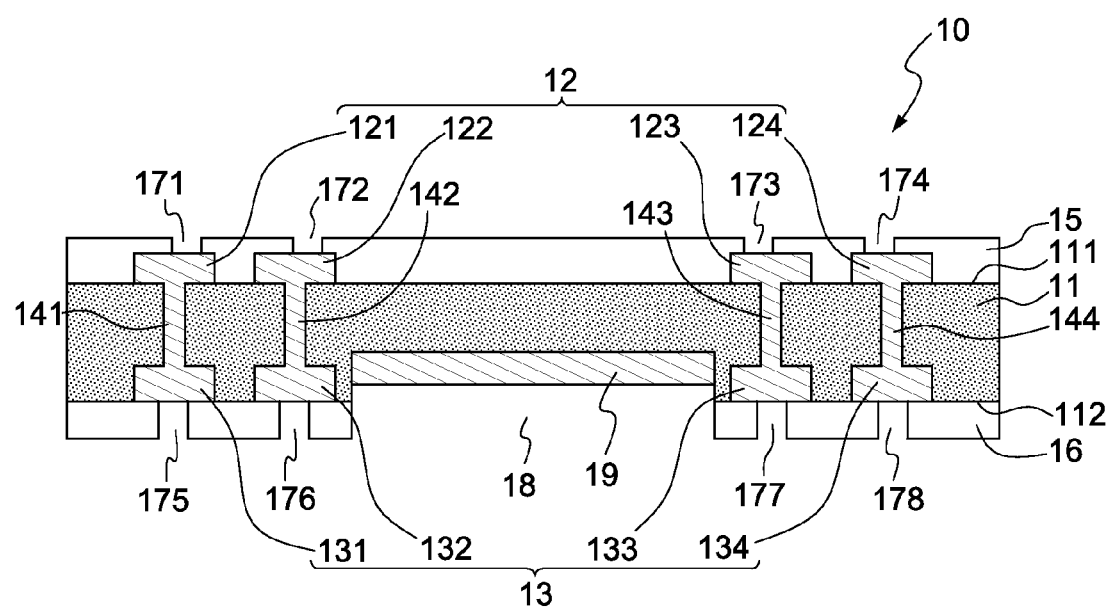

In FIG. 8D, another conductive layer 12 (i.e., the first conductive layer 12) and the conductive vias 141, 142, 143 and 144 are formed, for example by a pattern plating technique. The conductive vias 141, 142, 143 and 144 electrically connect the conductive layer 13 and the conductive layer 12. As shown in FIG. 8E, the carrier 81 and the metal layer 130 are removed to expose the conductive layer 13 and the protrusion 19. In FIG. 8F, masking and etching is performed, and the protrusion 19 is partially etched to form enough height for the cavity 18. An insulating layer 16 (i.e., the second insulation layer 16) is formed to cover most of the conductive layer 13, wherein one or more openings 175, 176, 177 and 178 of the insulating layer 16 are formed to expose the pads 131, 132, 133 and 134 of the conductive layer 13. Similarly, another insulating layer 15 (i.e., the first insulating layer 15) is formed to cover most of the conductive layer 12, wherein one or more openings 171, 172, 173 and 174 of the insulating layer 15 are formed to expose the pads 121, 122, 123 and 124 of the conductive layer 12. The interposer substrate of FIG. 1A is then formed.

An interposer substrate (e.g., interposer substrates 10, 20, 30, 40, 50 or 60) may include a combination of reinforcement structures. For example, an interposer substrate may include one or more of a ring (e.g., ring 21 of FIG. 2D), a second core layer (e.g., second core layer 311 of FIGS. 3A-3D) and a recess (e.g., recess 411 of FIGS. 4A-4C) in addition to a reinforcement layer 19. Further, maintaining the ratio of a thickness of the first insulating layer 15 to a thickness of the second insulating layer 16 less than one (e.g., FIG. 5) may be applied to any of the embodiments, and maintaining a ratio of a thickness of the first conductive layer 12 to a thickness of the second conductive layer 13 less than one (e.g., FIG. 6) may be applied to any of the embodiments.

While the disclosure has been described with reference to the specific embodiments thereof, it should be understood by those skilled in the art that various changes may be made and equivalents may be substituted without departing from the true spirit and scope of the disclosure as defined by the appended claims. In addition, many modifications may be made to adapt a particular situation, material, composition of matter, method, or process to the objective, spirit and scope of the disclosure. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations are not limitations of the disclosure.

What is claimed is:

1. An interposer substrate, comprising:
a first core layer;
a first conductive layer on a first side of the interposer substrate and comprising a plurality of first pads;
a second conductive layer on a second side of the interposer substrate and comprising a plurality of second pads, wherein the second side of the interposer substrate is opposite the first side of the interposer substrate;
a plurality of conductive vias electrically connecting the first conductive layer and the second conductive layer; and
a reinforcement structure in the interposer substrate;
wherein the interposer substrate defines a cavity.

2. The interposer substrate according to claim 1, wherein the reinforcement structure is a reinforcing layer formed inside the cavity and in contact with the first core layer.

3. The interposer substrate according to claim 2, wherein the reinforcing layer comprises a metal or a polymer.

4. The interposer substrate according to claim 2, wherein a thickness of the reinforcing layer is less than or equal to a depth of the cavity.

5. The interposer substrate according to claim 1, wherein the reinforcement structure is a ring formed around the cavity.

6. The interposer substrate according to claim 5, further comprising a first insulating layer on the first side of the interposer substrate.

7. The interposer substrate according to claim 6, wherein the ring is embedded in the first insulating layer.

8. The interposer substrate according to claim 6, further comprising a second insulating layer on the second side of the interposer substrate, wherein the ring is embedded in the second insulating layer.

9. The interposer substrate according to claim 5, wherein the ring is embedded in the first core layer.

10. The interposer substrate according to claim 1, wherein the reinforcement structure is a second core layer adjacent to the first core layer, wherein a ratio of the modulus of rigidity of the first core layer to the modulus of rigidity of the second core layer is less than one, and the second core layer and the cavity are on the same side of the interposer substrate.

11. The interposer substrate according to claim 10, wherein a thickness of the second conductive layer is substantially equal to a thickness of the second core layer.

12. The interposer substrate according to claim 1, further comprising a first insulating layer on the first side of the interposer substrate and a second insulating layer on the second side of the interposer substrate, wherein the first insulating layer defines a recess at a location corresponding to the cavity, wherein a size of the recess is not greater than a size of the cavity, and the recess and the cavity are on different sides of the interposer substrate.

13. The cavity interposer substrate according to claim 12, wherein the first core layer is partially exposed in the recess.

14. The interposer substrate according to claim 1, further comprising a first insulating layer on the first side of the interposer substrate and a second insulating layer on the second side of the interposer substrate, wherein the second insulating layer and the cavity are on the same side of the interposer substrate, and a ratio of a thickness of the first insulating layer to a thickness of the second insulating layer is less than one.

15. The interposer substrate according to claim 1, wherein the second conductive layer and the cavity are on the same side of the interposer substrate and a ratio of a thickness of the first conductive layer to a thickness of the second conductive layer is less than one.

16. The interposer substrate according to claim 1, wherein the second conductive layer and the cavity are on the same side of the interposer substrate, and the second conductive layer is embedded in the first core layer.

17. A semiconductor structure comprising:
a base substrate having a first surface including a plurality of base substrate pads thereon;
an interposer substrate comprising:
a first core layer,
a first conductive layer on a first side of the interposer substrate and comprising a plurality of first pads,
a second conductive layer on a second side of the interposer substrate and comprising a plurality of second pads,
a plurality of conductive vias electrically connecting the first conductive layer and the second conductive layer, and
a reinforcement structure in the interposer substrate, wherein the interposer substrate defines a cavity; and
wherein at least one of the first and the second pads is electrically coupled to at least one of the plurality of base substrate pads; and
a semiconductor device positioned at least partially within the cavity between the base substrate and the interposer substrate.

18. The semiconductor structure according to claim 17, wherein the reinforcement structure is a reinforcing layer formed inside the cavity and in contact with the first core layer.

19. The semiconductor structure according to claim 17, wherein the reinforcement structure is a ring formed around the cavity.

20. The semiconductor structure according to claim 17, wherein the reinforcement structure is a second core layer adjacent to the first core layer, wherein a ratio of the modulus of rigidity of the first core layer to the modulus of rigidity of the second core layer is less than one, and the second core layer and the cavity are on the same side of the interposer substrate.

21. A substrate, comprising:
a core layer, the core layer defining an accommodating cavity;
a first conductive layer disposed on a first surface of the core layer;
a second conductive layer embedded in the core layer and exposed at a second surface of the core layer;
a conductive via electrically connecting the first conductive layer with the second conductive layer;
a first insulating layer disposed over the core layer and the first conductive layer, the first insulating layer exposing portions of the first conductive layer;
a second insulating layer disposed over the core layer and exposing portions of the second conductive layer; and
a reinforcing structure configured to reduce warpage of the substrate.

22. The substrate of claim 21, wherein the reinforcing structure comprises a reinforcing layer disposed on the core layer within the cavity.

23. The substrate of claim 21, wherein the reinforcing structure comprises a ring structure.

24. The substrate of claim 21, wherein the core layer comprises a first core layer and a second core layer, the first core layer and the second core layer comprising different materials, and wherein the reinforcing structure comprises the second core layer.

* * * * *